US008263439B2

(12) United States Patent
Marimuthu et al.

(10) Patent No.: US 8,263,439 B2
(45) Date of Patent: *Sep. 11, 2012

(54) SEMICONDUCTOR DEVICE AND METHOD OF FORMING AN INTERPOSER PACKAGE WITH THROUGH SILICON VIAS

(75) Inventors: Pandi Chelvam Marimuthu, Singapore (SG); Nathapong Suthiwongsunthorn, Singapore (SG); Il Kwon Shim, Singapore (SG); Kock Liang Heng, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/905,825

(22) Filed: Oct. 15, 2010

(65) Prior Publication Data
US 2011/0024916 A1 Feb. 3, 2011

Related U.S. Application Data

(63) Continuation of application No. 12/325,587, filed on Dec. 1, 2008, now Pat. No. 7,838,337.

(51) Int. Cl.
*H01L 21/00* (2006.01)
(52) U.S. Cl. ............... 438/126; 257/724; 257/E21.512; 257/E23.141
(58) Field of Classification Search .................. 438/126, 438/667; 257/724, E23.145, E21.5, E21.512, 257/E21.511; 361/728
See application file for complete search history.

(56) References Cited

U.S. PATENT DOCUMENTS

| | | | |
|---|---|---|---|
| 7,838,337 B2* | 11/2010 | Marimuthu et al. | 438/110 |
| 2004/0227258 A1* | 11/2004 | Nakatani | 257/787 |
| 2009/0218671 A1 | 9/2009 | Kuwabara | |
| 2009/0261460 A1 | 10/2009 | Kuan et al. | |
| 2009/0267219 A1 | 10/2009 | Trezza | |
| 2009/0321947 A1* | 12/2009 | Pratt | 257/777 |

* cited by examiner

*Primary Examiner* — Caridad Everhart
(74) *Attorney, Agent, or Firm* — Robert A. Atkins; Patent Law Group: Atkins & Associates, P.C.

(57) ABSTRACT

A semiconductor device has a carrier for supporting the semiconductor device. A first semiconductor die is mounted over the carrier. A first dummy die having a first through-silicon via (TSV) is mounted over the carrier. The first semiconductor die and the first dummy die are encapsulated using a wafer molding material. The carrier is removed. A first redistribution layer (RDL) is formed over a first surface of the first semiconductor die and a first surface of the first dummy die to electrically connect the first TSV and a contact pad of the first semiconductor die. An insulation layer is formed over the first RDL. A second RDL is formed over a second surface of the first dummy die opposite the first surface of the first dummy die and electrically connected to the first TSV. A semiconductor package is connected to the second RDL.

31 Claims, 28 Drawing Sheets

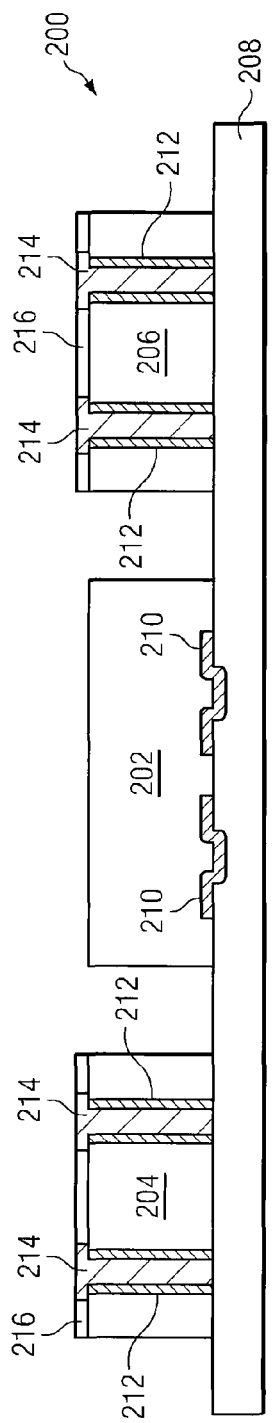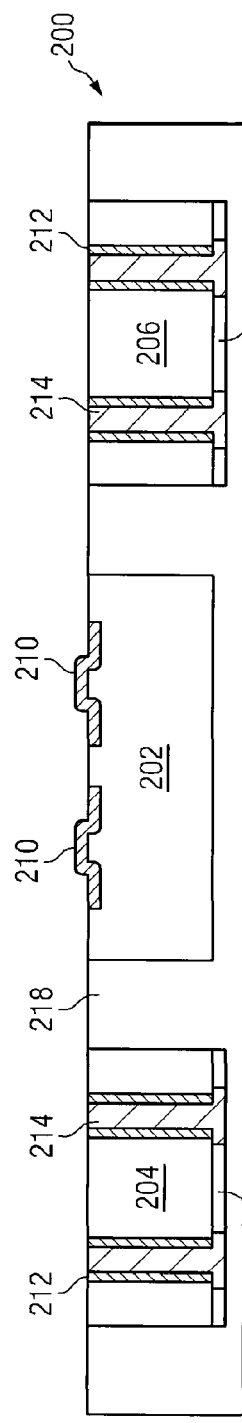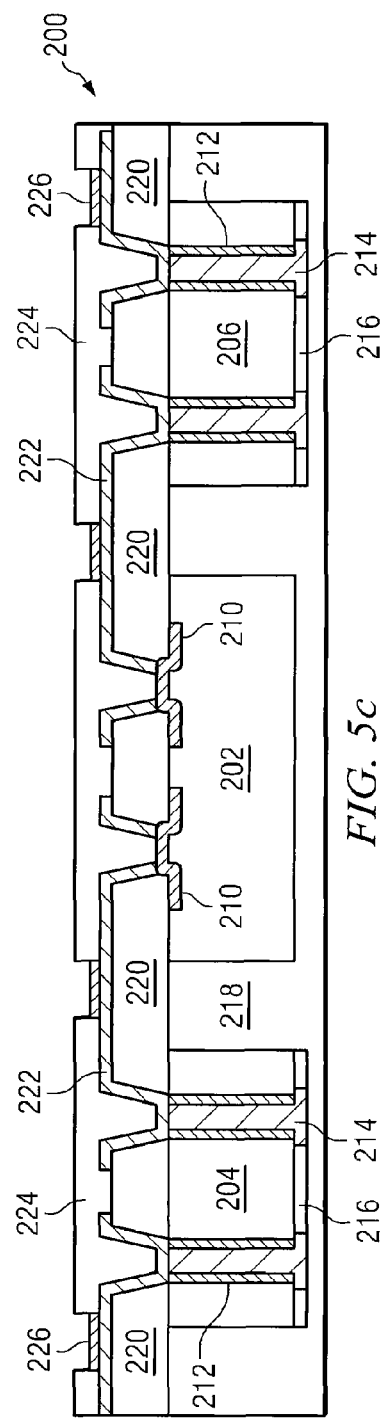

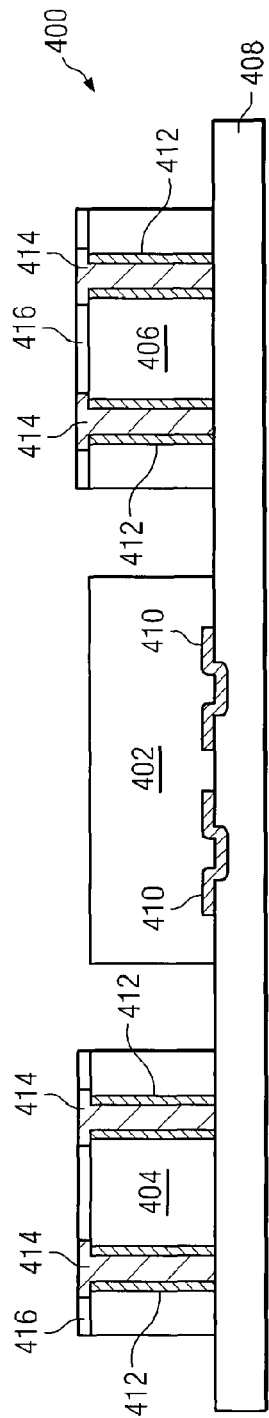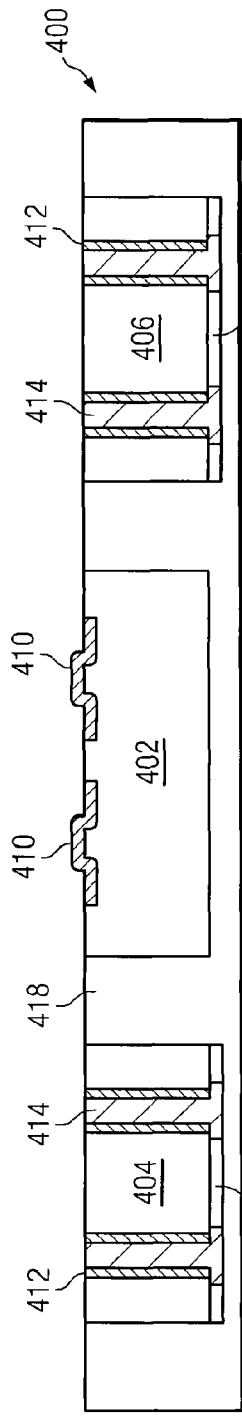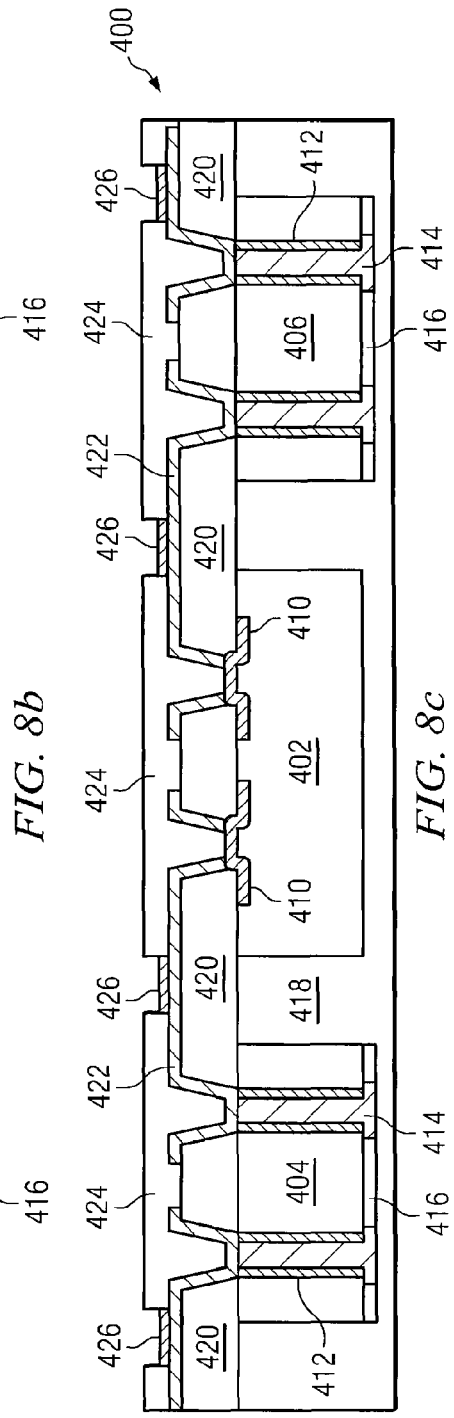

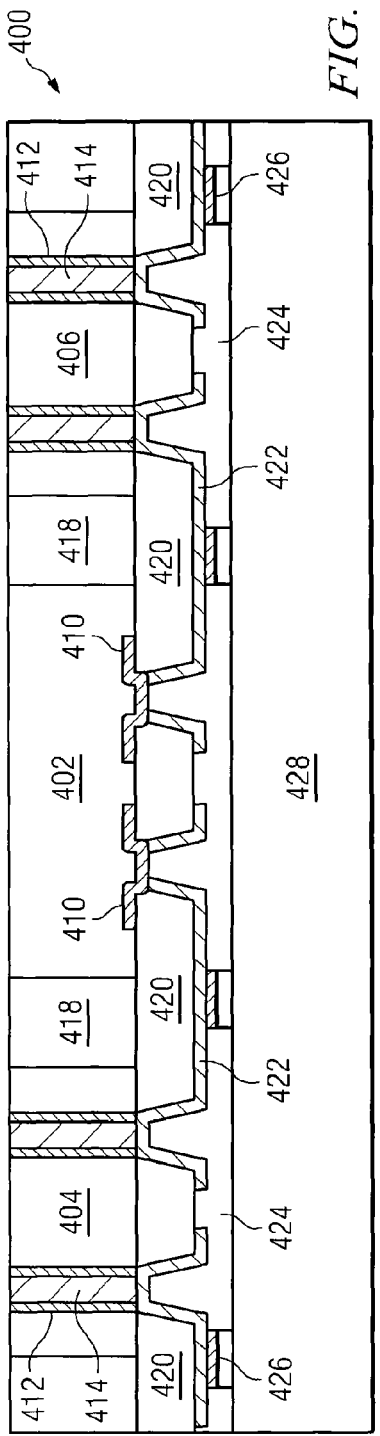
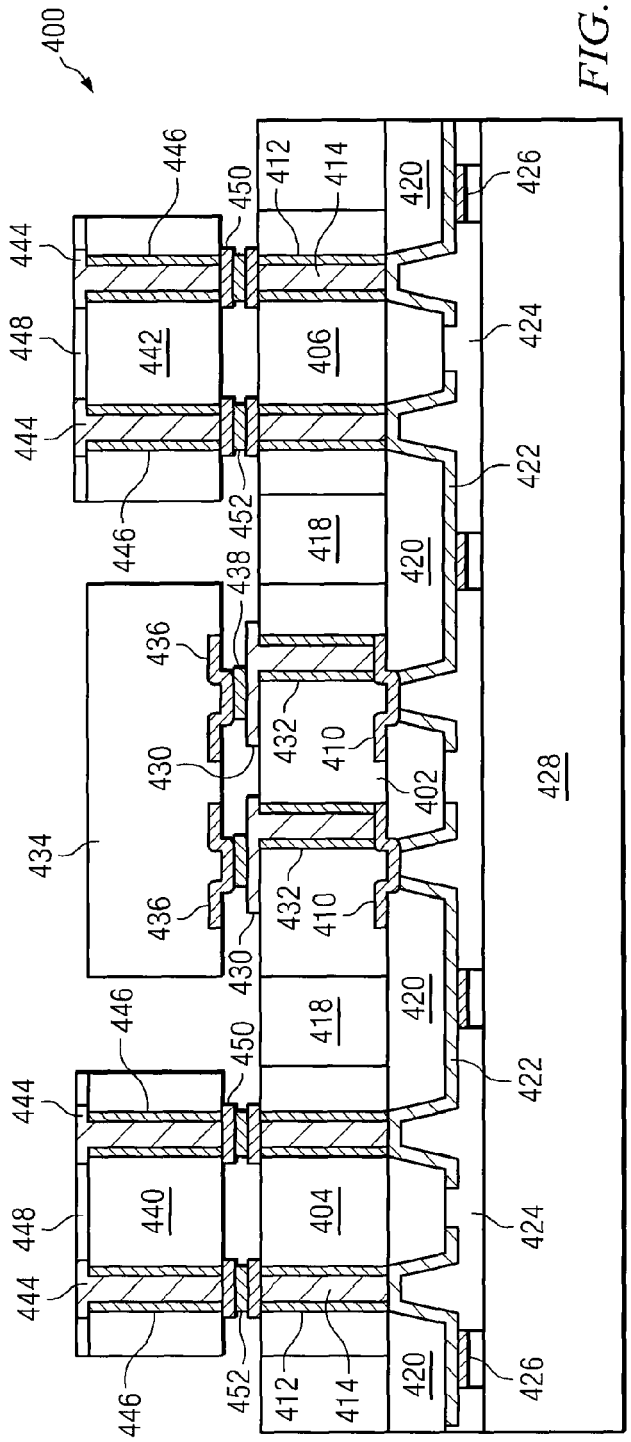

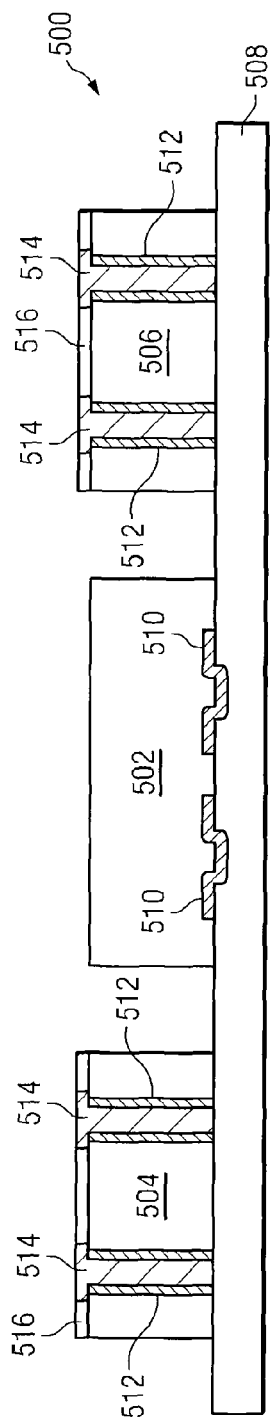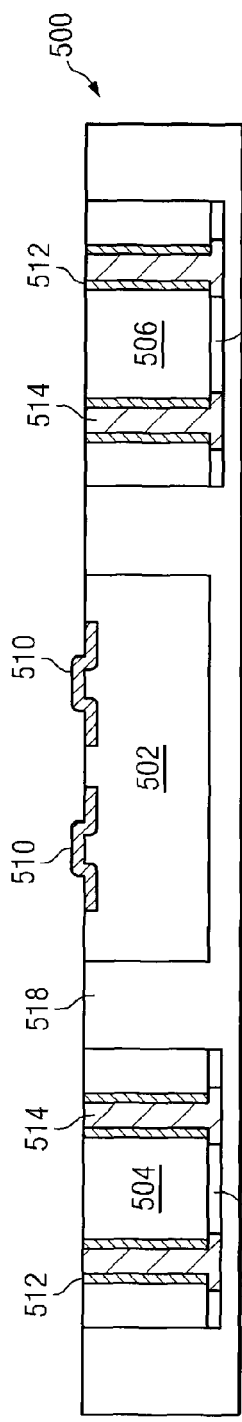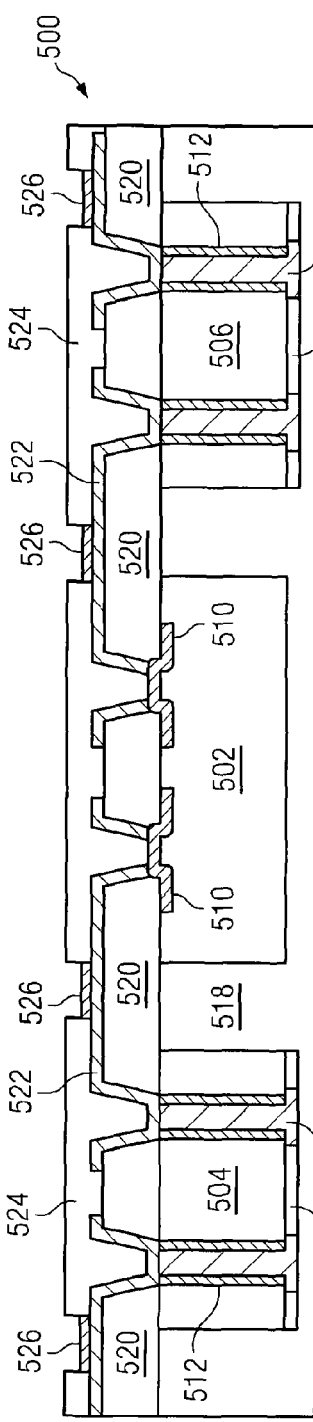

SEMICONDUCTOR DEVICE AND METHOD OF FORMING AN INTERPOSER PACKAGE WITH THROUGH SILICON VIAS

CLAIM OF DOMESTIC PRIORITY

The present application is a continuation of U.S. patent application Ser. No. 12/325,587, filed Dec. 1, 2008, and claims priority to the foregoing parent application pursuant to 35 U.S.C. §120.

FIELD OF THE INVENTION

The present invention relates in general to semiconductor devices and, more particularly, to a semiconductor device providing an interposer package having through-silicon vias.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In many applications, it is desirable to manufacture packages that combine several semiconductor dies into a single stacked package. Often, the dies are combined by the use of through-silicon vias (TSVs) which provide a conductive pathway to form the necessary electrical interconnections between each of the semiconductor dies. The manufacture of TSVs, however, requires additional expensive and complicated fabrication technologies. Often the TSVs are difficult to align as a result of warpage of the components. Also, conventional TSVs can only be tested after the via is formed and the semiconductor die is mounted to the package. As a result, the use of conventional TSVs in stacked packages increases the manufacturing cost of the package, and minimizes yield of the manufacturing process.

SUMMARY OF THE INVENTION

In one embodiment, the present invention is a method of making a semiconductor device including the steps of providing a carrier for supporting the semiconductor device, mounting a first semiconductor die over the carrier, mounting a first dummy die having a first TSV over the carrier, encapsulating the first semiconductor die and the first dummy die using a wafer molding material, and removing the carrier. The method further includes the steps of forming a first redistribution layer (RDL) over a first surface of the first semiconductor die and a first surface of the first dummy die to electrically connect the first TSV and a contact pad of the first semiconductor die. The method further includes the steps of forming an insulation layer over the first RDL, forming a second RDL over a second surface of the first dummy die opposite the first surface of the first dummy die and electrically connected to the first TSV, and connecting a semiconductor package to the second RDL.

In another embodiment, the present invention is a method of making a semiconductor device including the steps of providing a temporary carrier, mounting a first semiconductor die over the temporary carrier, and mounting a first dummy die having a first TSV over the temporary carrier. The method further includes the steps of depositing encapsulant over the first semiconductor die and the first dummy die, forming a first conductive layer electrically connected to the first semiconductor die and TSV, and forming a second conductive layer electrically connected to the TSV.

In another embodiment, the present invention is a method of making a semiconductor device including the steps of providing a carrier, mounting a first semiconductor die over the carrier, mounting a second semiconductor die including a conductive via over the carrier, forming a first conductive layer connected to the first semiconductor die and the conductive via, and forming a second conductive layer connected to the conductive via.

In another embodiment, the present invention is a semiconductor device including a first semiconductor die, a first dummy die including a TSV that has a first surface coplanar with a first surface of the first semiconductor die, and encapsulant deposited over the first semiconductor die and the first dummy die. The device further includes a first conductive layer formed over the first surface of the first semiconductor die and the first surface of the TSV to electrically connect the first semiconductor die and the TSV, and a second conductive layer connected to a second surface of the TSV opposite the first surface of the TSV.

BRIEF DESCRIPTION OF THE DRAWINGS

FIGS. 5a-5g illustrate a method of forming a semiconductor device providing a 3D interposer package having a plurality of TSV die, an RDL structure is formed over both sides of the substrate;

FIGS. 8a-8i illustrate a method of forming a semiconductor device providing a 3D interposer package having stacked TSV die, a die is flip-chip mounted to the semiconductor device; and FIGS. 9a-9i illustrate a method of forming a semiconductor device providing a 3D interposer package having stacked TSV die, a semiconductor package is mounted to the semiconductor device.

DETAILED DESCRIPTION OF THE DRAWINGS

Figure 1:
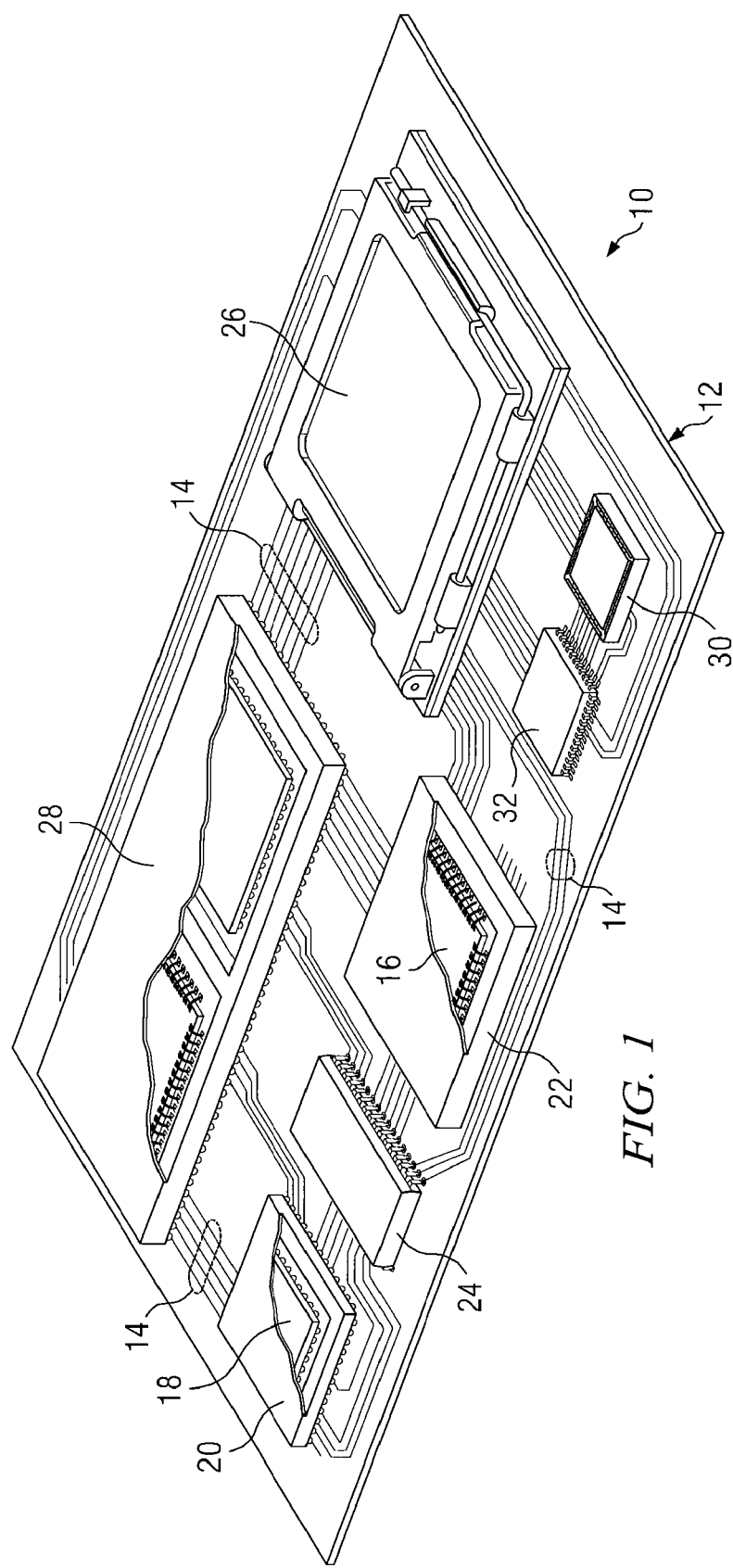
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
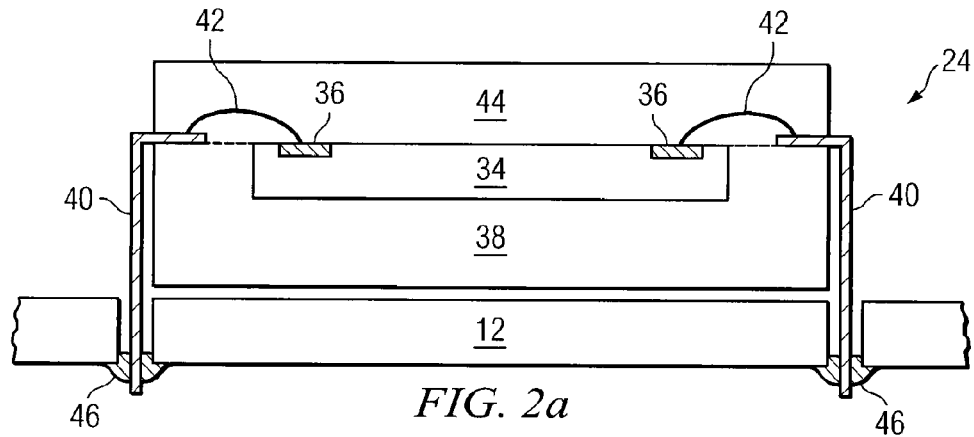
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
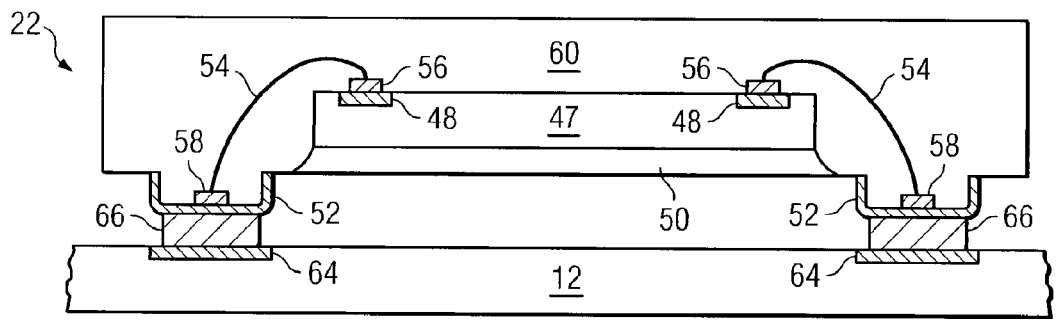

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active area containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active area of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66, which form a mechanical and electrical connection between BCC 22 and PCB 12.

Figure 2C:
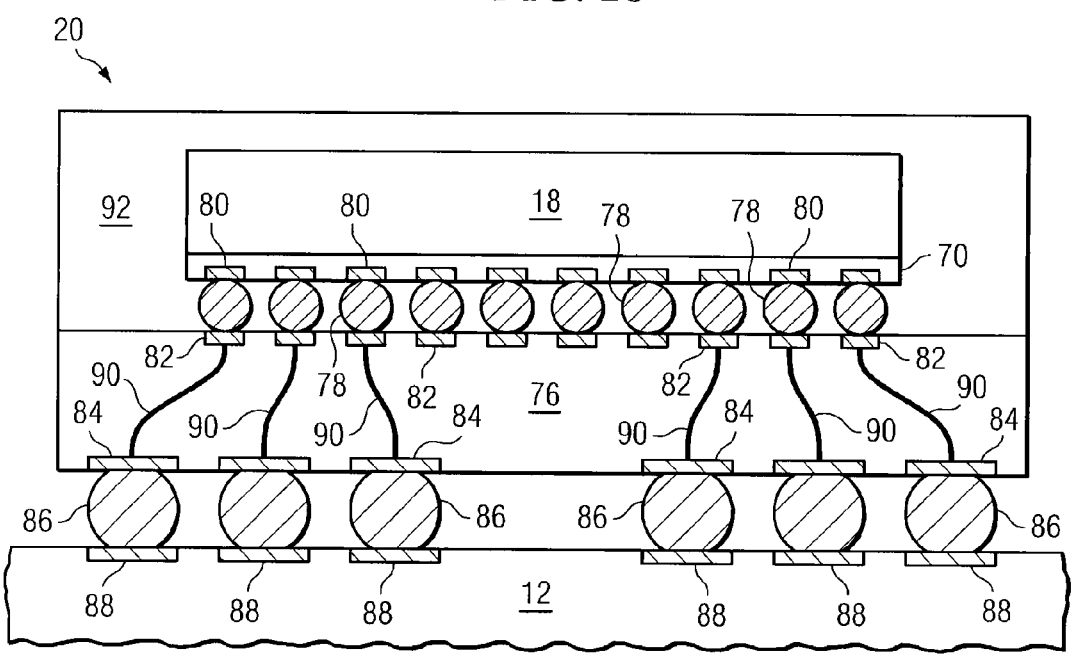

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
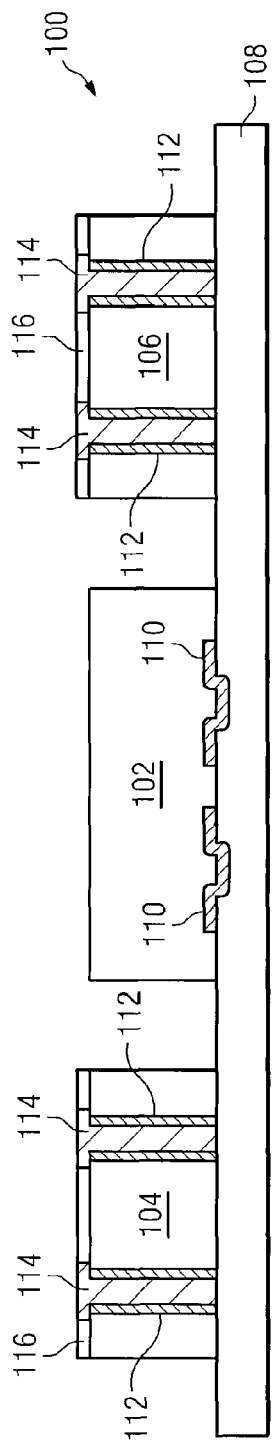
FIGS. 3a-3g illustrate a method of forming a semiconductor device providing a three-dimensional (3D) interposer package having a plurality of TSV die.

FIGS. 3a-3g illustrate a method of forming semiconductor device 100 providing a three-dimensional (3D) interposer package having a plurality of through-silicon via (TSV) die. Turning to FIG. 3a, dies 102, 104 and 106 are mounted to carrier 108. Carrier 108 includes a stiff material such as a glass wafer, Si, ceramic, quartz, or flexible tape substrate. Dies 102, 104 and 106 may include semiconductor devices, or other electronic chips or ICs and provide various functions such as memory, controller, ASICs, processor, microcontroller, or combinations thereof. In one embodiment, die 102 includes active ICs, while dies 104 and 106 represent 'dummy' or non-functional semiconductor dies having prefabricated TSVs. Dies 102, 104 and 106 may be attached to substrate 108 using an adhesive that includes an underfill or epoxy polymer material. Contact pads 110 are formed over a surface of die 102 using a conductive material, such as Al, Cu, Sn, Ni, Au, or Ag, and are electrically connected to the circuit elements formed within die 102. Contact pads 110 are formed by PVD, CVD, electrolytic plating, or electroless plating processes, for example. Vias are formed in dies 104 and 106 using deep reactive ion etching (DRIE), laser drilling, wet chemical etch, or another etching process. Insulation 112 is deposited into the vias to form a conformal coating within the vias. Insulation 112 is typically made with silicon dioxide (SiO2), but can also be made with silicon nitride (Si3N4), silicon oxynitride (SiON), tantalum pentoxide (Ta2O5), zircon (ZrO2), aluminum oxide (Al2O3), or other material having dielectric insulation properties. The deposition of insulation 112 involves PVD, CVD, printing, sintering, or thermal oxidation, for example. A conductive material is deposited into the vias to form through-silicon vias (TSVs) 114. TSVs 114 are formed using an evaporation, electrolytic plating, electroless plating, screen printing, PVD, or another suitable metal deposition process and include Al, Cu, Sn, Ni, Au, or Ag or another conductive material. In the present embodiment, TSVs 114 are formed before dies 104 and 106 are mounted to substrate 108 in a separate manufacturing process. An optional insulation or passivation layer 116 is formed over a surface of dies 104 and 106. Insulation layer 116 may be formed before or after TSVs 114.

Figure 3B:
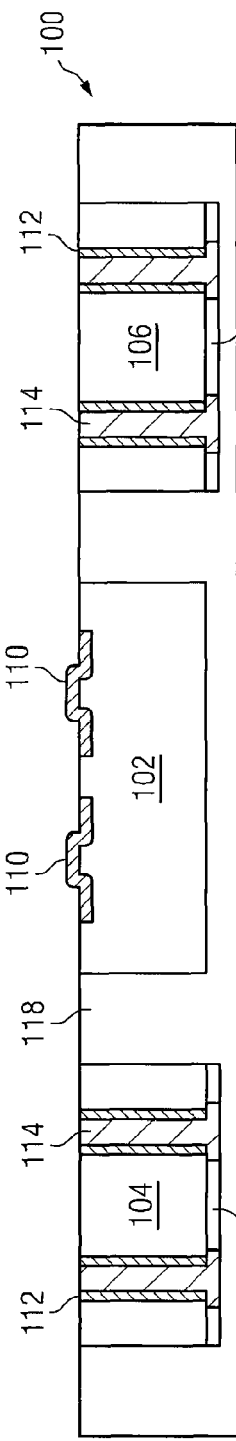

Turning to FIG. 3b, molding compound 118 is deposited over device 100 to provide electrical isolation and physical support. Molding compound 118 includes epoxy acrylate or other polymer material and is applied by transfer molding, liquid encapsulant molding, or other molding processes. Carrier 108 is removed and device 100 is inverted.

Figure 3C:
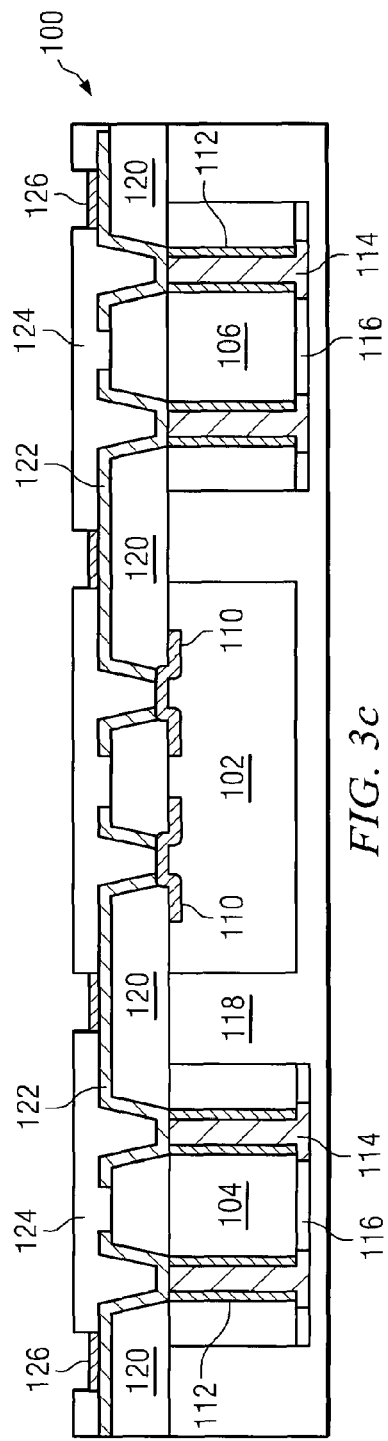

Turning to FIG. 3c, a redistribution layer (RDL) is formed over device 100. The RDL operates as a conductive network to route electrical signals to various areas of the package, including active and passive circuits of the various semiconductor die, and provides various electrical interconnect options during package integration. Passivation layer 120 is deposited and patterned over dies 102, 104 and 106 and may include an insulation material such as polyimide, benzocyclobutene (BCB), polybenzoxazoles (PBO), epoxy based insulating polymer, or other insulating materials. Passivation layer 120 is patterned to expose TSVs 114 of dies 104 and 106 and contact pads 110 of die 102. Metal layer 122 is deposited and patterned over passivation layer 120. Metal layer 122 may include multiple layers of conductive material and may be formed using a PVD, CVD, electrolytic plating, or electroless plating process. Passivation layer 124 is formed over metal layer 122. Passivation layer 124 is patterned to expose portions of metal layer 122. Metal layer 126 is deposited over passivation layer 124. In one embodiment, metal layer 126 includes an under-bump metallization (UBM) that is formed over the exposed portions of metal layer 122. In one embodiment, the UBM includes a wetting layer, barrier layer, and adhesive layer.

Figure 3D:
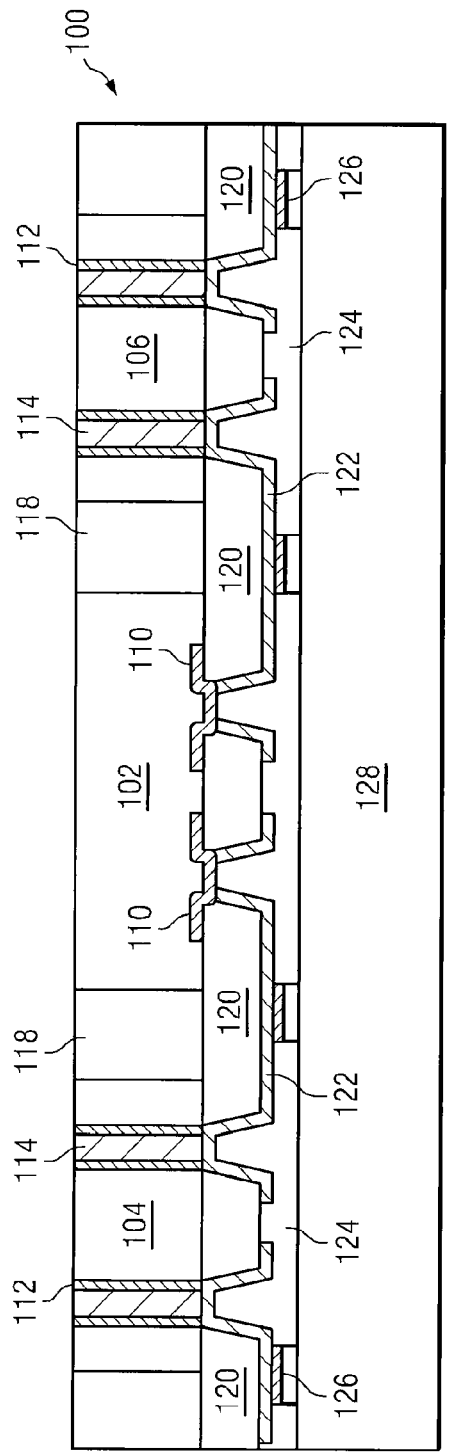

Turning to FIG. 3d, device 100 is inverted and molding compound 118 is thinned to expose a backside of die 102 and dies 104 and 106. Molding compound 118 may be thinned using a chemical-mechanical planarization (CMP), mechanical backgrinding, plasma etching, wet etch, dry etch or another thinning process. Carrier 128 is mounted to device 100 to provide physical support and includes a stiff substrate material.

Figure 3E:
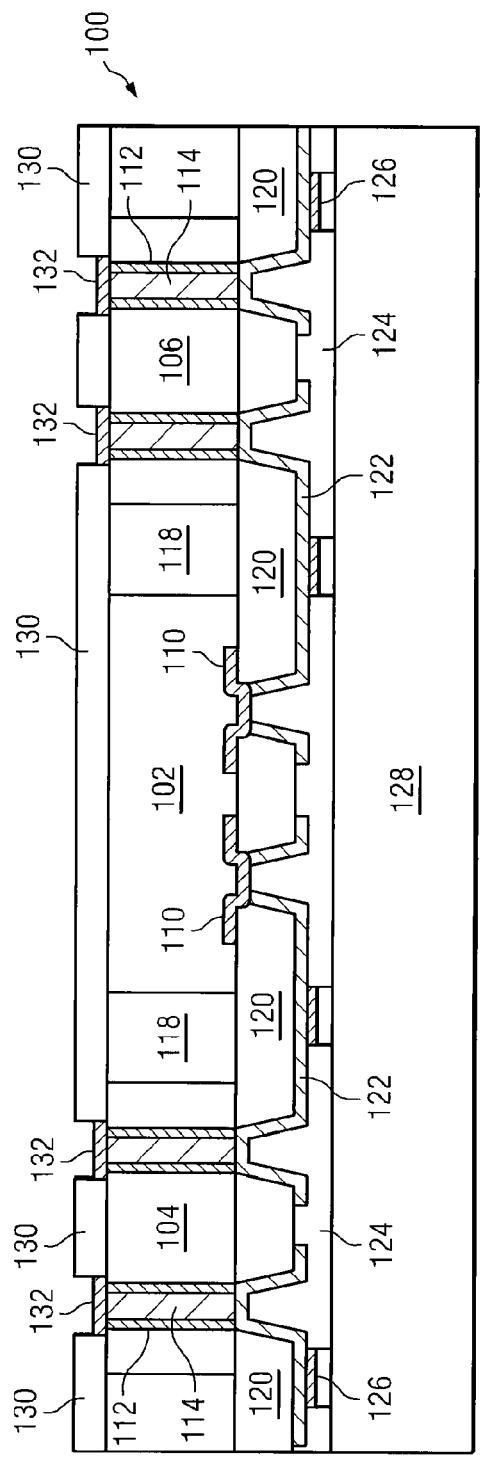

Turning to FIG. 3e, an additional RDL structure is formed over device 100. Passivation layer 130 includes an insulative material and is deposited over dies 102, 104 and 106. Passivation layer 130 is patterned to expose TSVs 114 of dies 104 and 106. Metal layer 132 is deposited over passivation layer 130. In one embodiment, metal layer 132 includes a UBM that is formed over TSVs 114. In one embodiment, the UBM includes a wetting layer, barrier layer, and adhesive layer.

Figure 3F:
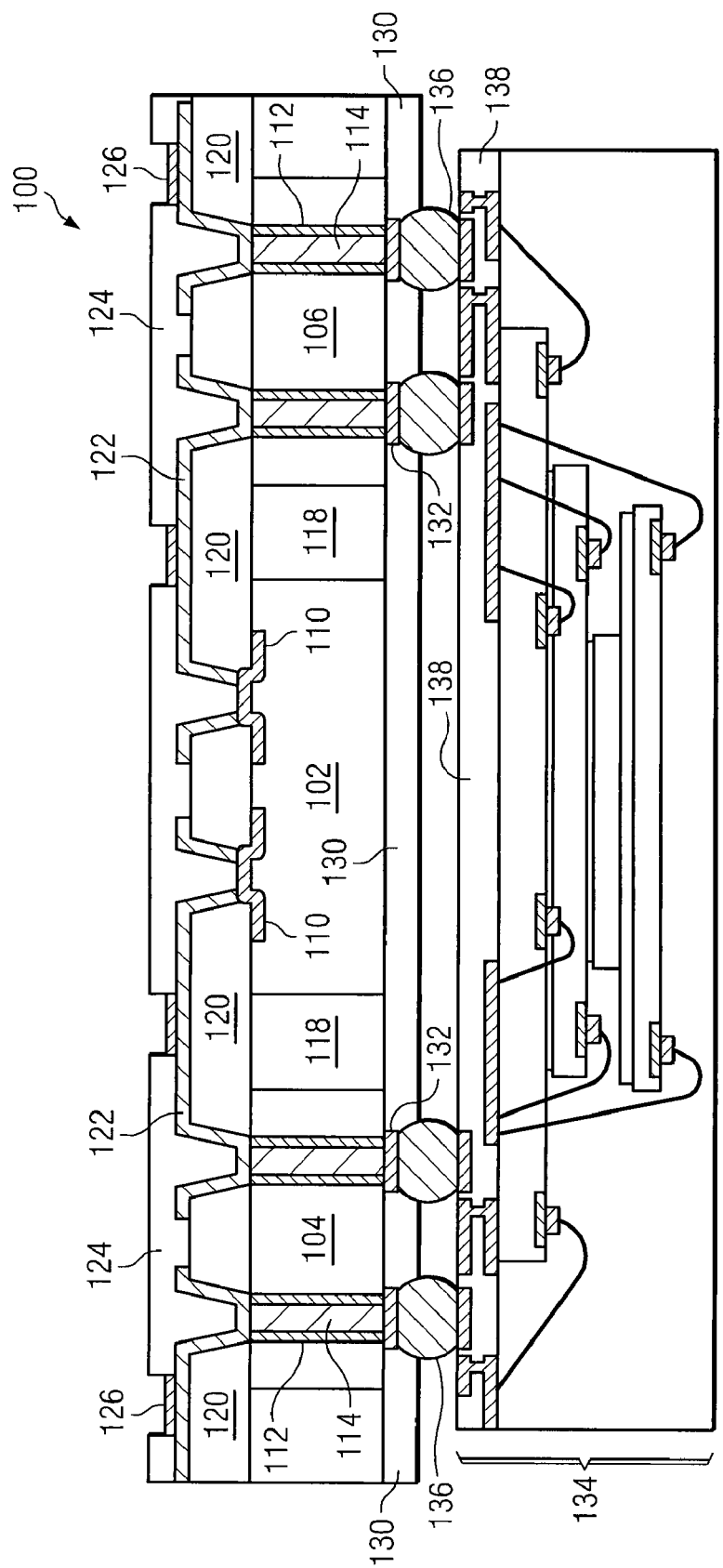

Turning to FIG. 3f, semiconductor package 134 is mounted to device 100 using solder bumps 136. Package 134 includes one or more pre-packaged semiconductor die and includes contact pads for connecting package 134 to external systems. Package 134 includes general application integrated circuits such as filters, memory chips, and processors, for example. Package 134 is connected to device 100 using solder bumps 136. Bumps 136 include an electrically conductive material such as solder, Sn, Pb, Au, Ag, Cu, Zn, Bi, and alloys thereof, with an optional flux material. For example, the solder material can be eutectic Sn/Pb, high lead, or lead free. The solder material is deposited between metal layer or UBM 132 and the contact pads of package 134. The solder material is then reflowed to form bumps 136 which form an electrical and mechanical connection between package 134 and device 100. In alternative embodiments, other interconnect structures such as stud bumping, wirebonds or conductive pillars are used to form the connection between package 134 and device 100.

In one embodiment, as shown in FIG. 3f, package 134 includes substrate or PCB 138 over which a plurality of semiconductor dies are mounted. Substrate 138 includes contact pads formed over opposing surfaces of substrate 138 and an interconnect structure formed in substrate 138 to connect the contact pads. The semiconductor dies are mounted over substrate 138 using die attach adhesive. The dies are electrically connected to one another and substrate 138 using a plurality of wirebonds. A molding or encapsulant material is deposited over the dies and substrate 138 to provide electrical isolation and mechanical protection for package 134. In alternative embodiments, however, package 134 includes any combination of semiconductor dies and other components to provide the required functionality. In many cases, package 134 is pre-manufactured and tested before being integrated into device 100. After mounting package 134, carrier 128 may be removed.

Figure 3G:
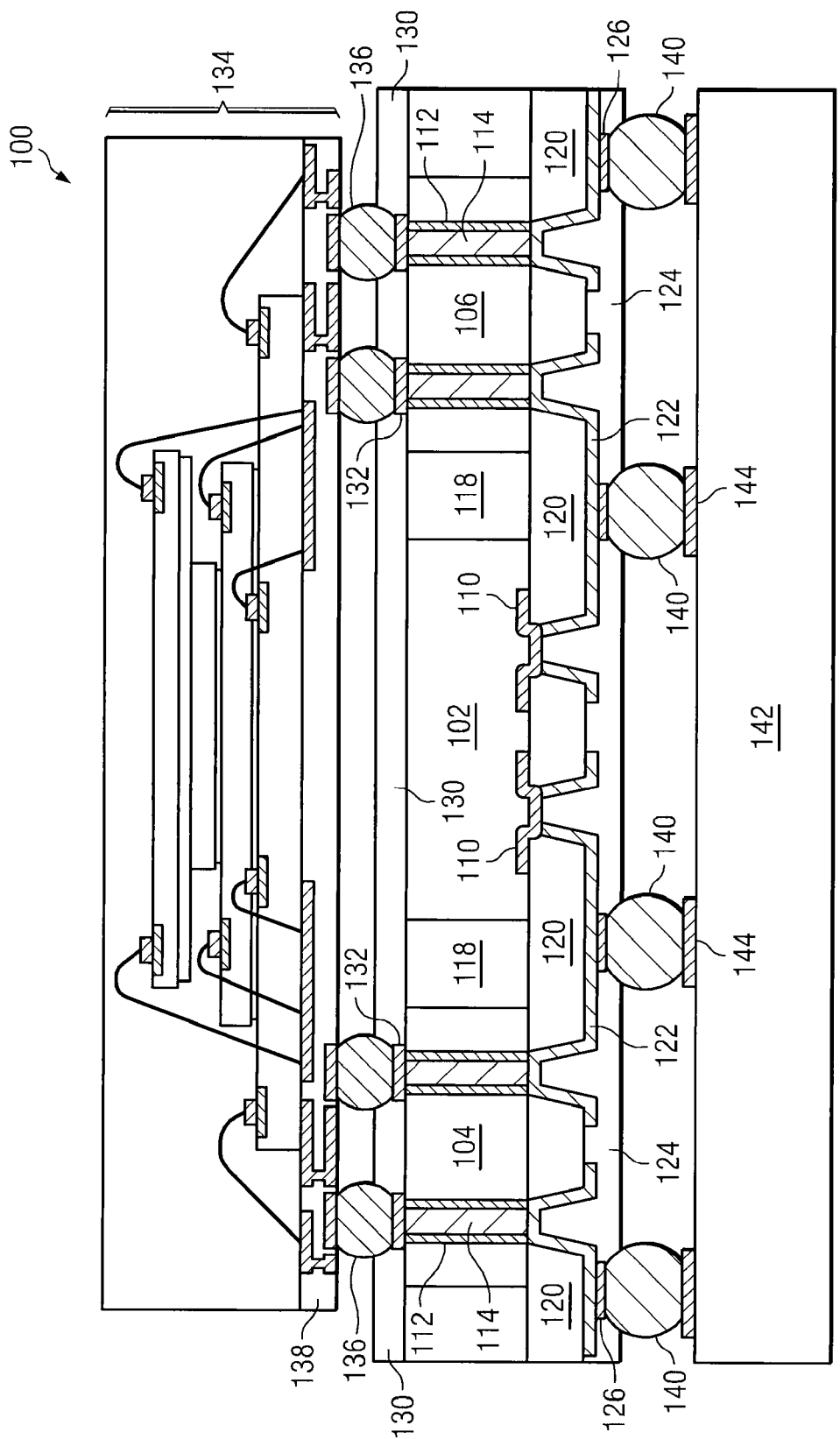

Turning to FIG. 3g, an optional interconnect structure is connected to device 100. The interconnect structure includes solder bumps 140 deposited over insulation layer 124 and electrically connected to metal layer 126. Bumps 140 include an electrically conductive material such as solder. The conductive material is deposited over the patterned regions of insulation layer 124 and is reflowed to form bumps 140. In alternative embodiments, other interconnect structures such as stud bumps, microbumps, pillar bumps, wirebonds, conductive pillars, or other metal connection structures using Cu, Au, or Ni, for example, are connected to semiconductor device 100 to allow for the connection of external system components.

As shown in FIG. 3g, device 100 is singulated and mounted to PCB or substrate 142. Contact pads 144 are formed over a surface of substrate 142 and include a conductive material. Bumps 140 are mounted to contact pads 144 and are reflowed to form an electrical and mechanical connection between device 100 and substrate 142.

Using this method, a semiconductor device including a 3D interposer package is manufactured. The device includes dummy dies having TSVs for forming electrical connections between circuits formed over a first surface of the device and circuits formed over a second surface of the device. Accordingly, the semiconductor device enables the formation of 3D packages for use in package-on-package (POP) and flip chip applications. Also, because dummy dies are used, the TSVs are formed in the dies before they are integrated into the final package. Accordingly, the manufacturing process is simplified, improving device yield.

Figure 4:
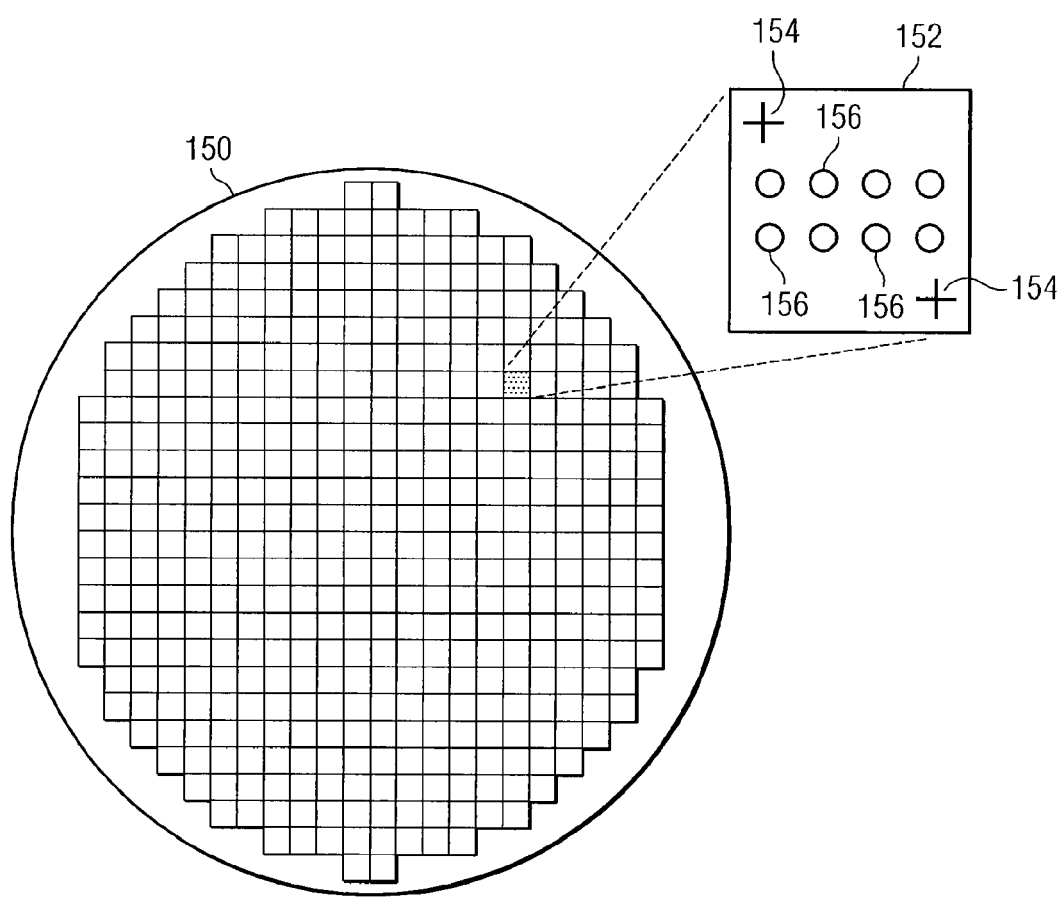
FIG. 4 illustrates a top view of a wafer having a plurality of dummy dies having TSVs for use in the semiconductor device of FIGS. 3a-3g.

FIG. 4 illustrates a top view of a wafer having a plurality of dummy dies having TSVs for use in semiconductor device 100. Wafer 150 includes a Si substrate or other material suitable for the formation of semiconductor devices. A plurality of dies are formed over wafer 150. As shown on FIG. 4, die 152 includes alignment markings 154 to facilitate placement of dummy die 152 over substrate 108 when manufacturing semiconductor device 100. TSVs 156 are pre-manufactured within die 152 during die fabrication.

Figure 5D:
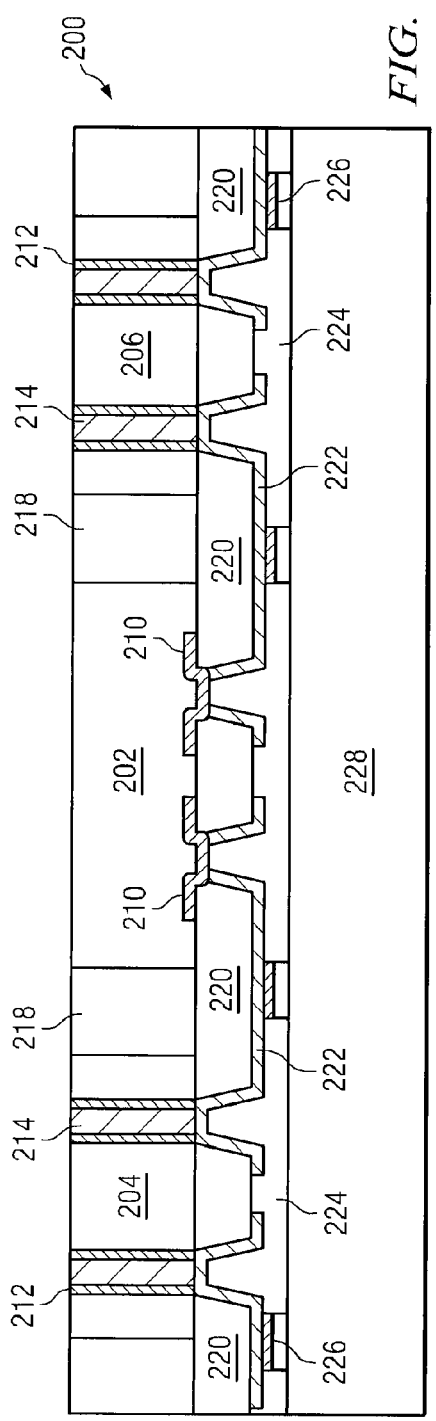

FIGS. 5a-5g illustrate a method of forming semiconductor device 200 providing a 3D interposer package having a plurality of TSV die, an RDL structure is formed over both sides of substrate 208. Turning to FIG. 5a, dies 202, 204 and 206 are mounted to carrier 208. Carrier 208 includes a stiff material such as a glass wafer, Si, ceramic, quartz, or flexible tape substrate. In one embodiment, die 202 includes active ICs, while dies 204 and 206 represent 'dummy' or non-functional semiconductor dies having pre-fabricated TSVs. Contact pads 210 are formed over a surface of die 202 using a conductive material, such as Al, Cu, Sn, Ni, Au, or Ag, and are electrically connected to the circuit elements formed within die 202. Contact pads 210 are formed by PVD, CVD, electrolytic plating, or electroless plating processes, for example. Vias are formed in dies 204 and 206 using DRIE, laser drilling, or another etching process. Insulation 212 is deposited into the vias to form a conformal coating within the vias. Insulation 212 is typically made with SiO2, but can also be made with Si3N4, SiON, Ta2O5, ZrO2, Al2O3, or other material having dielectric insulation properties. A conductive material is deposited into the vias to form TSVs 214. TSVs 214 are formed using an evaporation, electrolytic plating, electroless plating, screen printing, PVD, or another suitable metal deposition process and include Al, Cu, Sn, Ni, Au, or Ag or another conductive material. In the present embodiment, TSVs 214 are formed before dies 204 and 206 are mounted to substrate 208 in a separate manufacturing process. An optional insulation or passivation layer 216 is formed over a surface of dies 204 and 206. Insulation layer 216 may be formed before or after TSVs 214.

Turning to FIG. 5b, molding compound 218 is deposited over device 200 to provide electrical isolation and physical support. Molding compound 218 includes epoxy acrylate or other polymer material and is applied by transfer molding, liquid encapsulant molding, or other molding processes. Carrier 208 is removed and device 200 is inverted.

Turning to FIG. 5c, an RDL is formed over device 200. The RDL operates as a conductive network to route electrical signals to various areas of the package, including active and passive circuits of the various semiconductor die, and provides various electrical interconnect options during package integration. Passivation layer 220 is deposited and patterned over dies 202, 204 and 206 and may include an insulation material such as polyimide, BCB, PBO, epoxy based insulating polymer, or other insulating materials. Passivation layer 220 is patterned to expose TSVs 214 of dies 204 and 206 and contact pads 210 of die 202. Metal layer 222 is deposited and patterned over passivation layer 220. Metal layer 222 may include multiple layers of conductive material and may be formed using a PVD, CVD, electrolytic plating, or electroless plating process. Passivation layer 224 is formed over metal layer 222. Passivation layer 224 is patterned to expose portions of metal layer 222. Metal layer 226 is deposited over passivation layer 224. In one embodiment, metal layer 226 includes a UBM that is formed over the exposed portions of metal layer 222. In one embodiment, the UBM includes a wetting layer, barrier layer, and adhesive layer.

Turning to FIG. 5d, device 200 is inverted and molding compound 218 is thinned to expose a backside of die 202 and dies 204 and 206. Molding compound 218 may be thinned using a CMP, mechanical backgrinding, plasma etching, wet etch, dry etch or another thinning process. Carrier 228 is mounted to device 200 to provide physical support and includes a stiff substrate material.

Figure 5E:
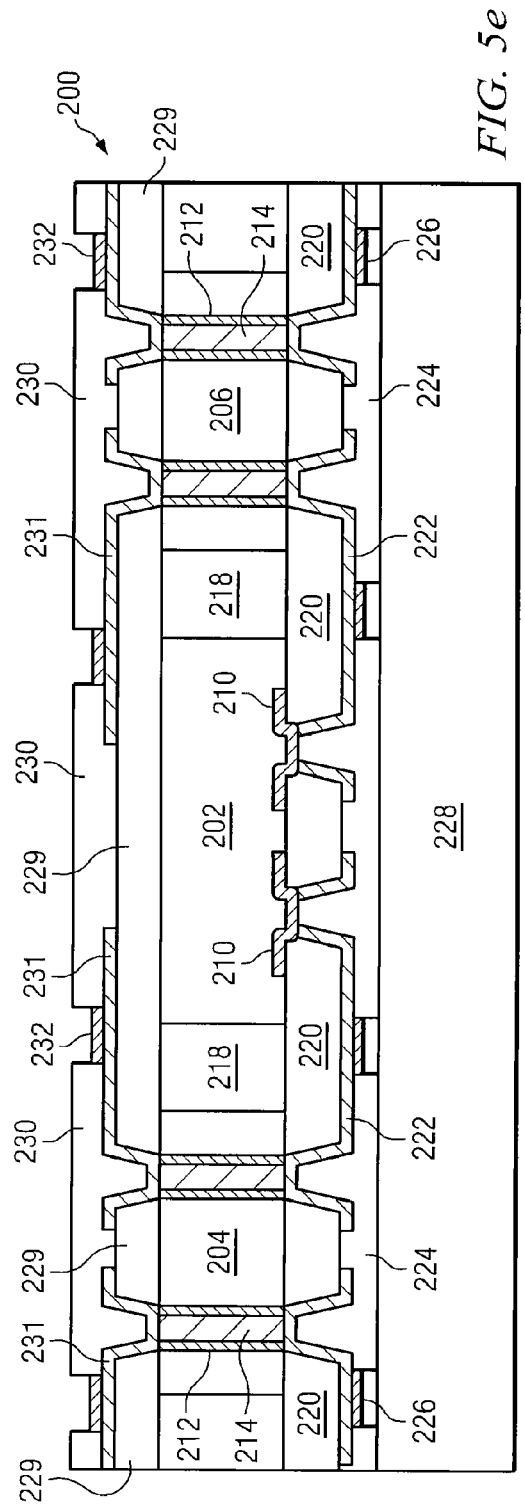

Turning to FIG. 5e, an additional RDL structure is formed over device 200. Passivation layer 229 includes an insulative material and is deposited over dies 202, 204 and 206. Passivation layer 229 is patterned to expose TSVs 214 of dies 204 and 206. Metal layer 231 is deposited over passivation layer 229 and forms an electrical connection with TSVs 214 of dies 204 and 206. Passivation layer 230 includes an insulative material and is deposited over metal layer 231. Passivation layer 230 is patterned to expose portions of metal layer 231. Metal layer 232 is deposited over passivation layer 230. In one embodiment, metal layer 232 includes a UBM that is formed over TSVs 214. In one embodiment, the UBM includes a wetting layer, barrier layer, and adhesive layer.

Figure 5F:
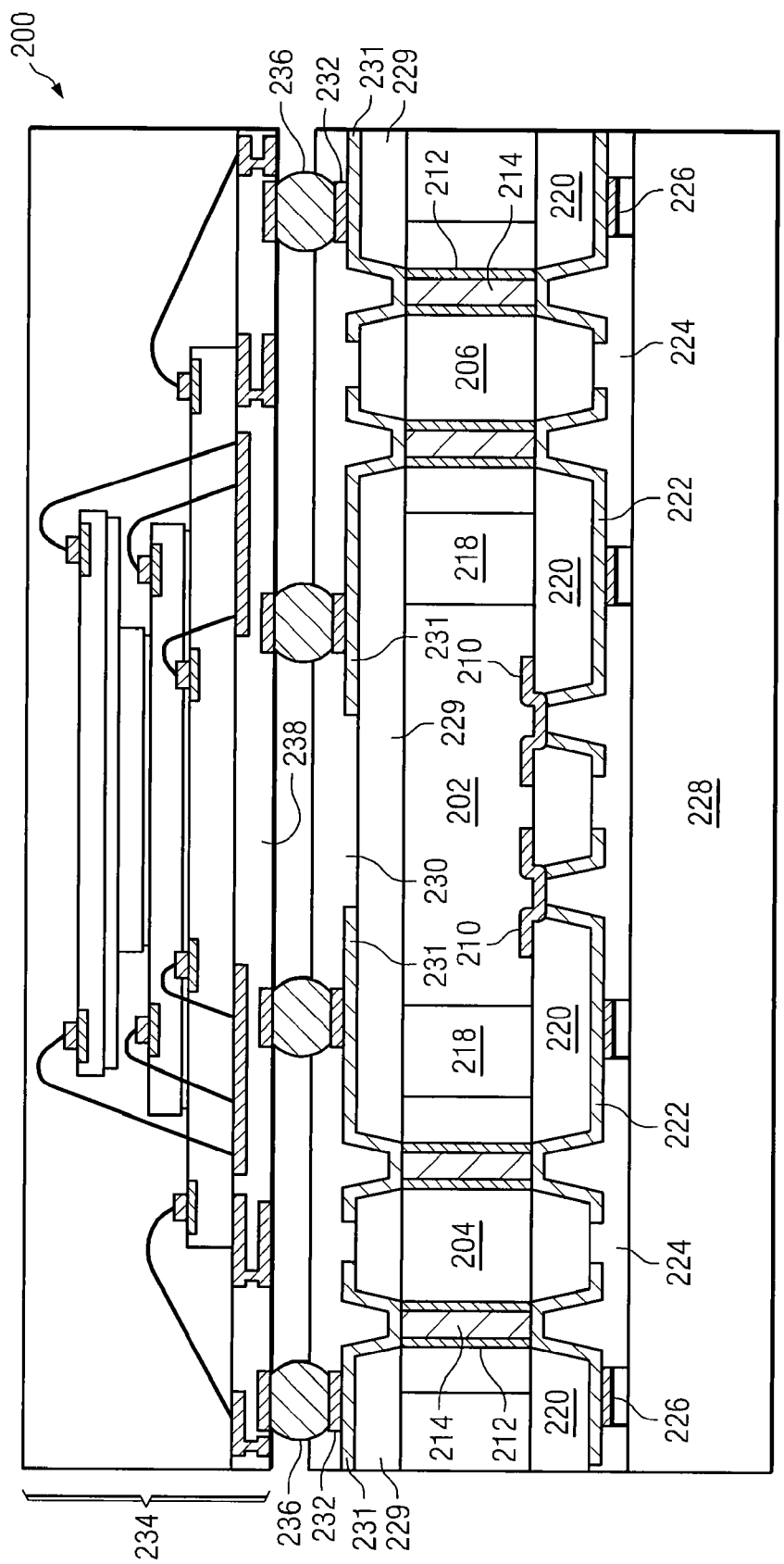

Turning to FIG. 5f, semiconductor package 234 is mounted to device 200 using solder bumps 236. Package 234 includes one or more pre-packaged semiconductor die and includes contact pads for connecting package 234 to external systems. Package 234 includes general application integrated circuits such as filters, memory chips, and processors, for example. Package 234 is connected to device 200 using solder bumps 236. Bumps 236 include an electrically conductive material such as solder, Sn, Pb, Au, Ag, Cu, Zn, Bi, and alloys thereof, with an optional flux material. For example, the solder material can be eutectic Sn/Pb, high lead, or lead free. The solder material is deposited between metal layer or UBM 232 and the contact pads of package 234. The solder material is then reflowed to form bumps 236 which form an electrical and mechanical connection between package 234 and device 200. In alternative embodiments, other interconnect structures such as stud bumping, wirebonds or conductive pillars are used to form the connection between package 234 and device 200.

In one embodiment, as shown in FIG. 5f, package 234 includes substrate or PCB 238 over which a plurality of semiconductor dies are mounted. Substrate 238 includes contact pads formed over opposing surfaces of substrate 238 and an interconnect structure formed in substrate 238 to connect the contact pads. The semiconductor dies are mounted over substrate 238 using die attach adhesive. The dies are electrically connected to one another and substrate 238 using a plurality of wirebonds. A molding or encapsulant material is deposited over the dies and substrate 238 to provide electrical isolation and mechanical protection for package 234. In alternative embodiments, however, package 234 includes any combination of semiconductor dies and other components to provide the required functionality. In many cases, package 234 is pre-manufactured and tested before being integrated into device 200. After mounting package 234, carrier 228 may be removed.

Figure 5G:
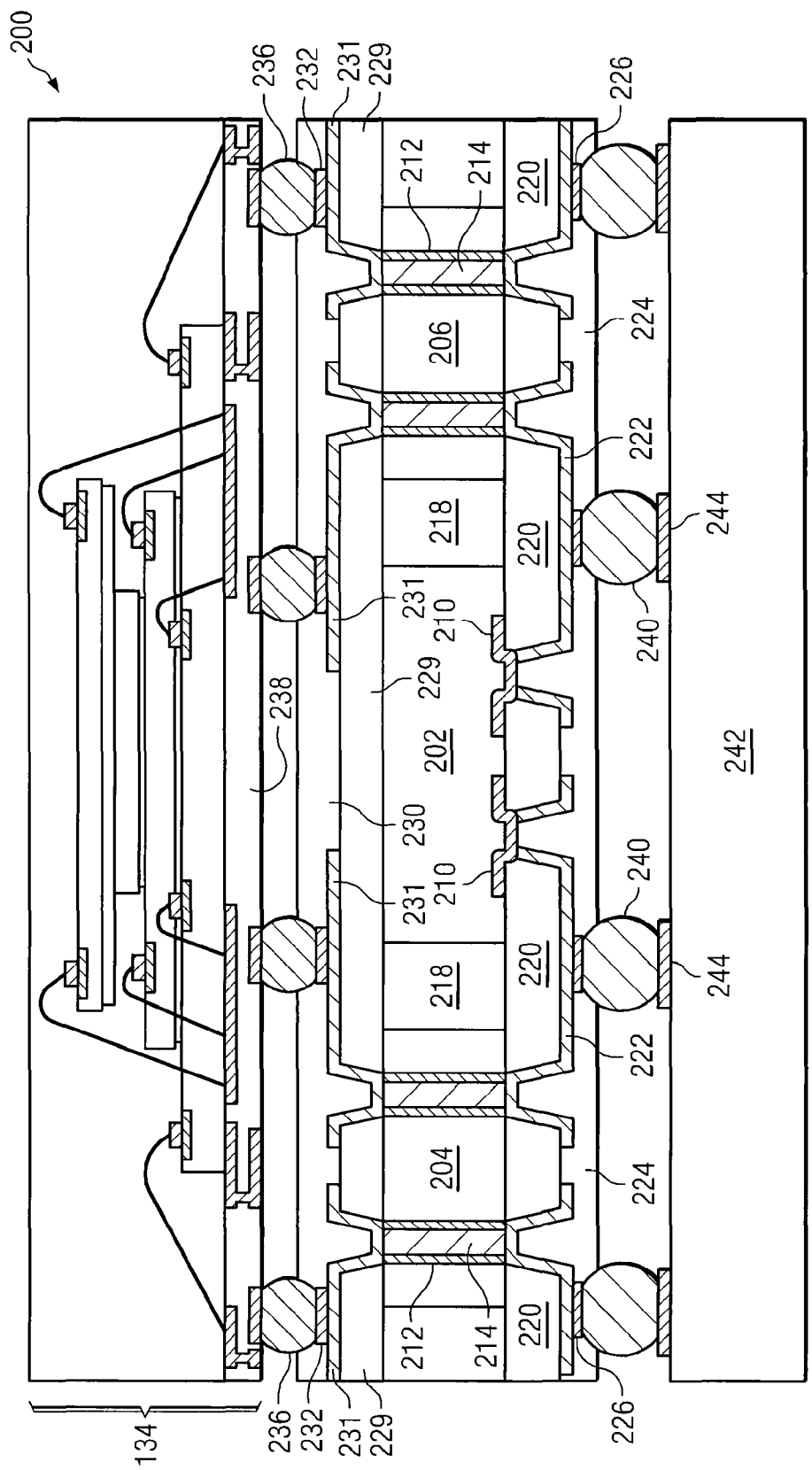

Turning to FIG. 5g, an optional interconnect structure is connected to device 200. The interconnect structure includes solder bumps 240 deposited over insulation layer 224 and electrically connected to metal layer 226. Bumps 240 include an electrically conductive material such as solder. The conductive material is deposited over the patterned regions of insulation layer 224 and is reflowed to form bumps 240. In alternative embodiments, other interconnect structures such as stud bumps, microbumps, pillar bumps, wirebonds, conductive pillars, or other metal connection structures using Cu, Au, or Ni, for example, are connected to semiconductor device 200 to allow for the connection of external system components.

As shown in FIG. 5g, device 200 is mounted to PCB or substrate 242. Contact pads 244 are formed over a surface of substrate 242 and include a conductive material. Bumps 240 are mounted to contact pads 244 and are reflowed to form an electrical and mechanical connection between device 200 and substrate 242.

Figure 6A:
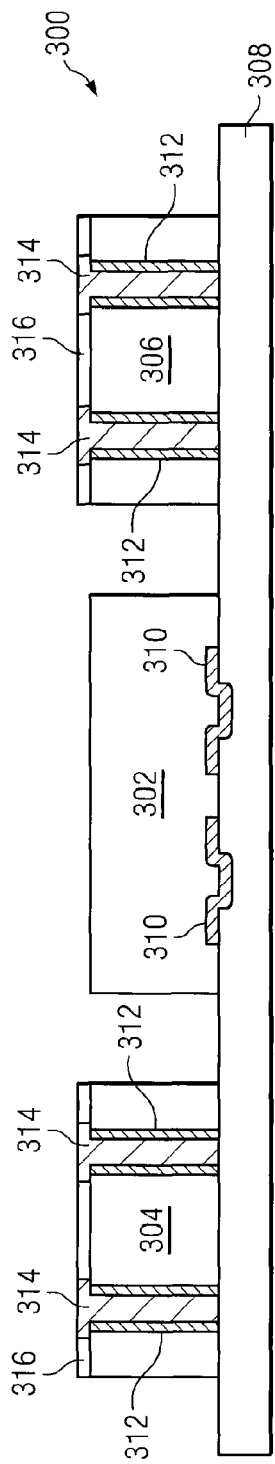
FIGS. 6a-6g illustrate a method of forming a semiconductor device providing a 3D interposer package having a plurality of TSV die, a die is flip-chip mounted to the semiconductor device.

FIGS. 6a-6g illustrate a method of forming semiconductor device 300 providing a 3D interposer package having a plurality of TSV die, a die is flip-chip mounted to semiconductor device 300. Turning to FIG. 6a, dies 302, 304 and 306 are mounted to carrier 308. Carrier 308 includes a stiff material such as a glass wafer, Si, ceramic, quartz, or flexible tape substrate. In one embodiment, die 302 includes active ICs, while dies 304 and 306 represent 'dummy' or non-functional semiconductor dies having pre-fabricated TSVs. Contact pads 310 are formed over a surface of die 302 using a conductive material, such as Al, Cu, Sn, Ni, Au, or Ag, and are electrically connected to the circuit elements formed within die 302. Contact pads 310 are formed by PVD, CVD, electrolytic plating, or electroless plating processes, for example. Vias are formed in dies 304 and 306 using DRIE, laser drilling, or another etching process. Insulation 312 is deposited into the vias to form a conformal coating within the vias. Insulation 312 is typically made with SiO2, but can also be made with Si3N4, SiON, Ta2O5, ZrO2, Al2O3, or other material having dielectric insulation properties. A conductive material is deposited into the vias to form TSVs 314. TSVs 314 are formed using an evaporation, electrolytic plating, electroless plating, screen printing, PVD, or another suitable metal deposition process and include Al, Cu, Sn, Ni, Au, or Ag or another conductive material. In the present embodiment, TSVs 314 are formed before dies 304 and 306 are mounted to substrate 308 in a separate manufacturing process. An optional insulation or passivation layer 316 is formed over a surface of dies 304 and 306. Insulation layer 316 may be formed before or after TSVs 314.

Figure 6B:
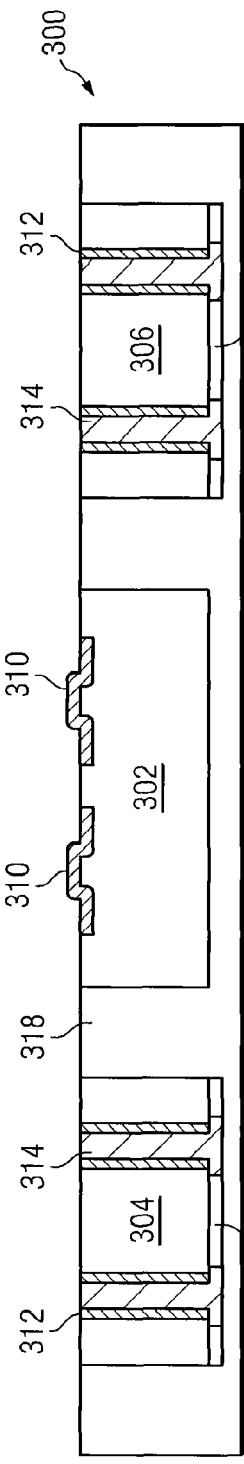

Turning to FIG. 6b, molding compound 318 is deposited over device 300 to provide electrical isolation and physical support. Molding compound 318 includes epoxy acrylate or other polymer material and is applied by transfer molding, liquid encapsulant molding, or other molding processes. Carrier 308 is removed and device 300 is inverted.

Figure 6C:
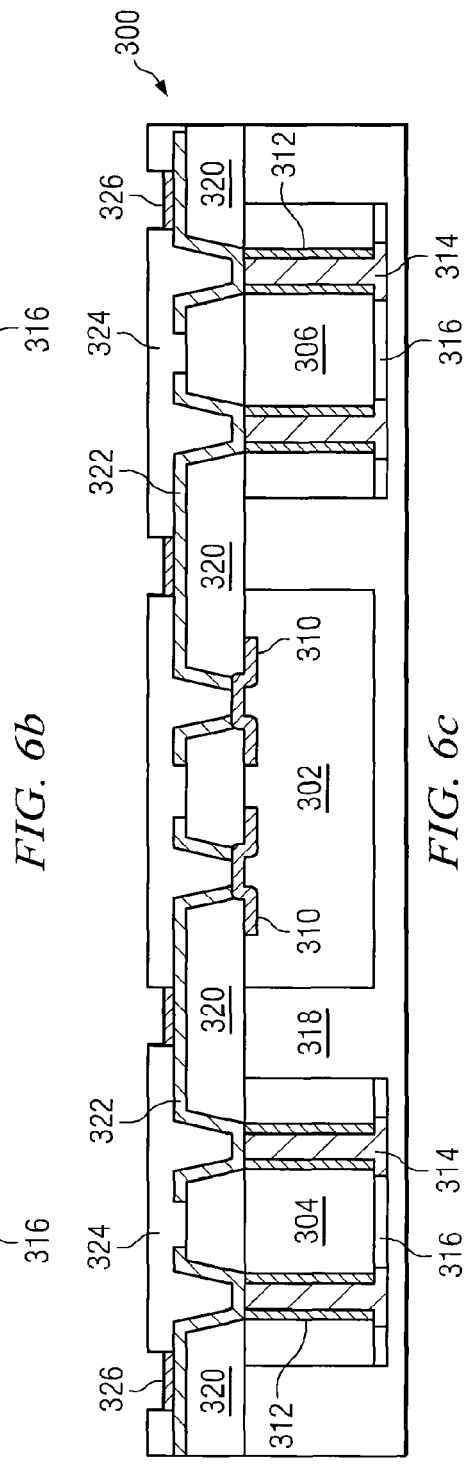

Turning to FIG. 6c, an RDL is formed over device 300. The RDL operates as a conductive network to route electrical signals to various areas of the package, including active and passive circuits of the various semiconductor die, and provides various electrical interconnect options during package integration. Passivation layer 320 is deposited and patterned over dies 302, 304 and 306 and may include an insulation material such as polyimide, BCB, PBO, epoxy based insulating polymer, or other insulating materials. Passivation layer 320 is patterned to expose TSVs 314 of dies 304 and 306 and contact pads 310 of die 302. Metal layer 322 is deposited and patterned over passivation layer 320. Metal layer 322 may include multiple layers of conductive material and may be formed using a PVD, CVD, electrolytic plating, or electroless plating process. Passivation layer 324 is formed over metal layer 322. Passivation layer 324 is patterned to expose portions of metal layer 322. Metal layer 326 is deposited over passivation layer 324. In one embodiment, metal layer 326 includes a UBM that is formed over the exposed portions of metal layer 322. In one embodiment, the UBM includes a wetting layer, barrier layer, and adhesive layer.

Figure 6D:
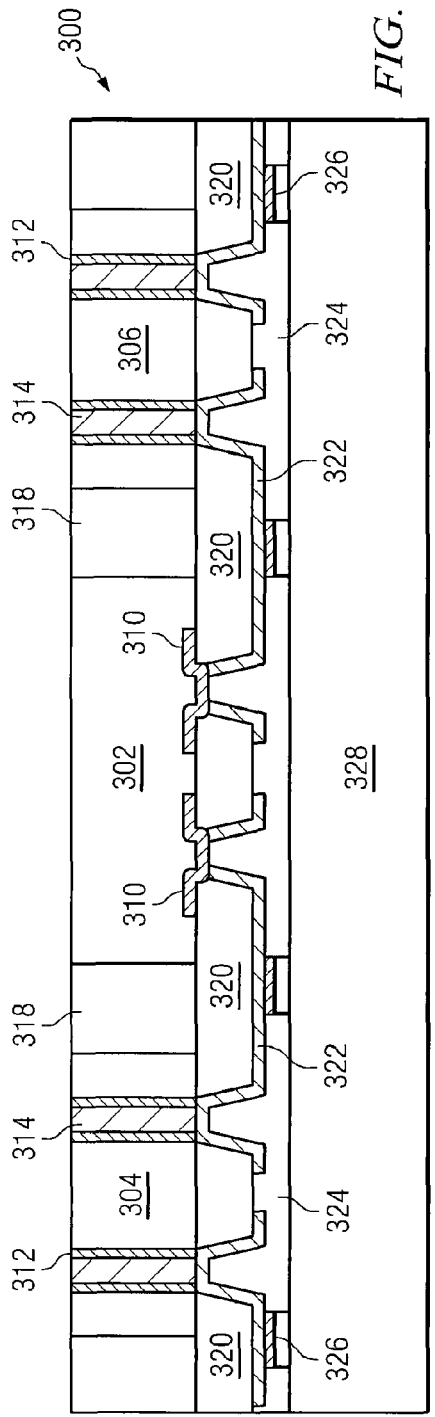

Turning to FIG. 6d, device 300 is inverted and molding compound 318 is thinned to expose a backside of die 302 and dies 304 and 306. Molding compound 318 may be thinned using a CMP, mechanical backgrinding, plasma etching, wet etch, dry etch or another thinning process. Carrier 328 is mounted to device 300 to provide physical support and includes a stiff substrate material.

Figure 6E:
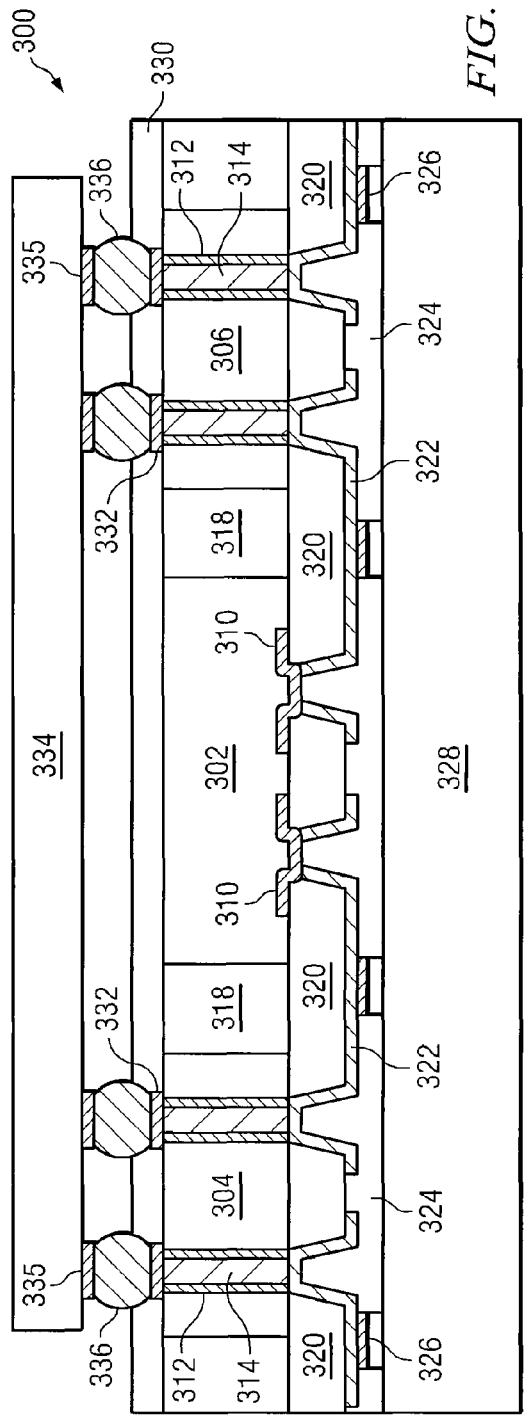

Turning to FIG. 6e, an additional RDL structure is formed over device 300. Passivation layer 330 includes an insulative material and is deposited over dies 302, 304 and 306. Passivation layer 330 is patterned to expose TSVs 314 of dies 304 and 306. Metal layer 332 is deposited over passivation layer 330. In one embodiment, metal layer 332 includes a UBM that is formed over TSVs 314. In one embodiment, the UBM includes a wetting layer, barrier layer, and adhesive layer.

Die 334 is mounted to device 300 using solder bumps 336. Die 334 includes contact pads 335 formed over a surface of die 334 using a conductive material, such as Al, Cu, Sn, Ni, Au, or Ag. Contact pads 335 are formed by PVD, CVD, electrolytic plating, or electroless plating processes, for example. Die 334 includes general application integrated circuits such as filters, memory, and processors, for example. Die 334 is connected to device 300 using solder bumps 336. Bumps 336 include an electrically conductive material such as solder, Sn, Pb, Au, Ag, Cu, Zn, Bi, and alloys thereof, with an optional flux material. For example, the solder material can be eutectic Sn/Pb, high lead, or lead free. The solder material is deposited between metal layer or UBM 332 and contact pads 335 of die 334. The solder material is then reflowed to form bumps 336 which form an electrical and mechanical connection between die 334 and device 300. In alternative embodiments, other interconnect structures such as stud bumping, wirebonds or conductive pillars are used to form the connection between die 334 and device 300.

Figure 6F:
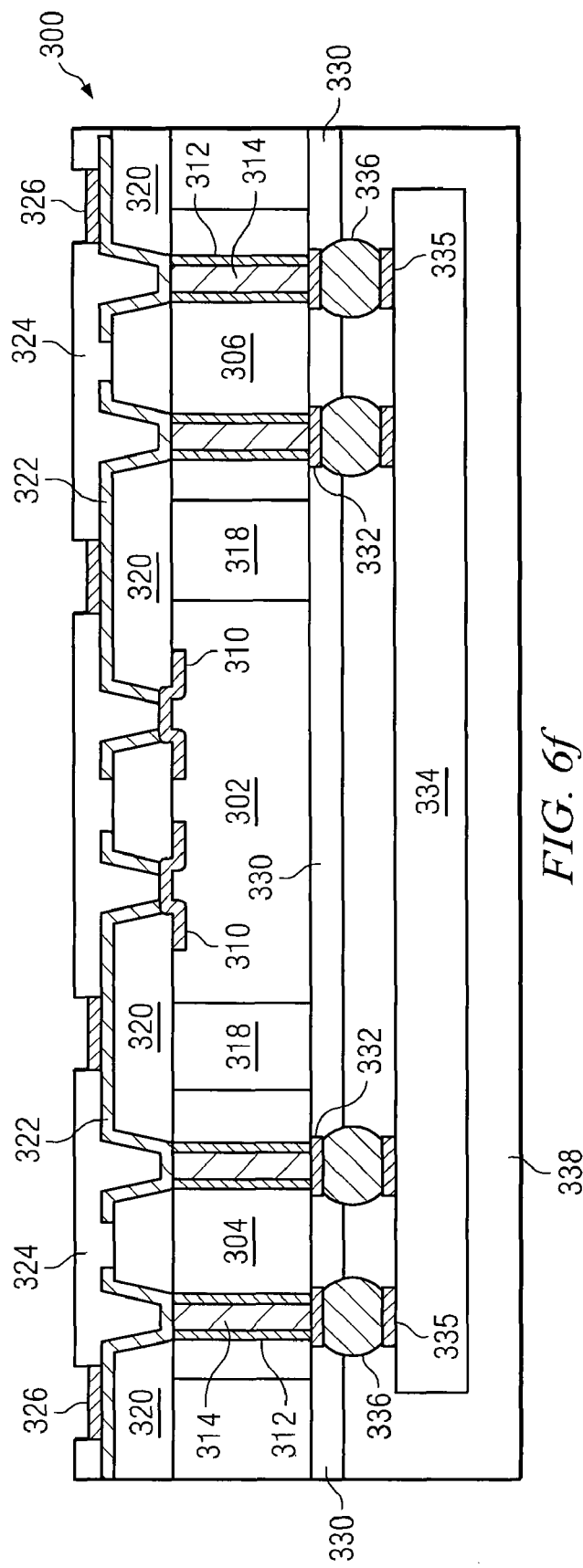

Turning to FIG. 6f, molding compound 338 is deposited over die 334 to provide electrical isolation and mechanical protection. Molding compound 338 includes epoxy acrylate or other polymer material and is applied by transfer molding, liquid encapsulant molding, or other molding processes. Carrier 328 is removed and device 300 is inverted.

Figure 6G:
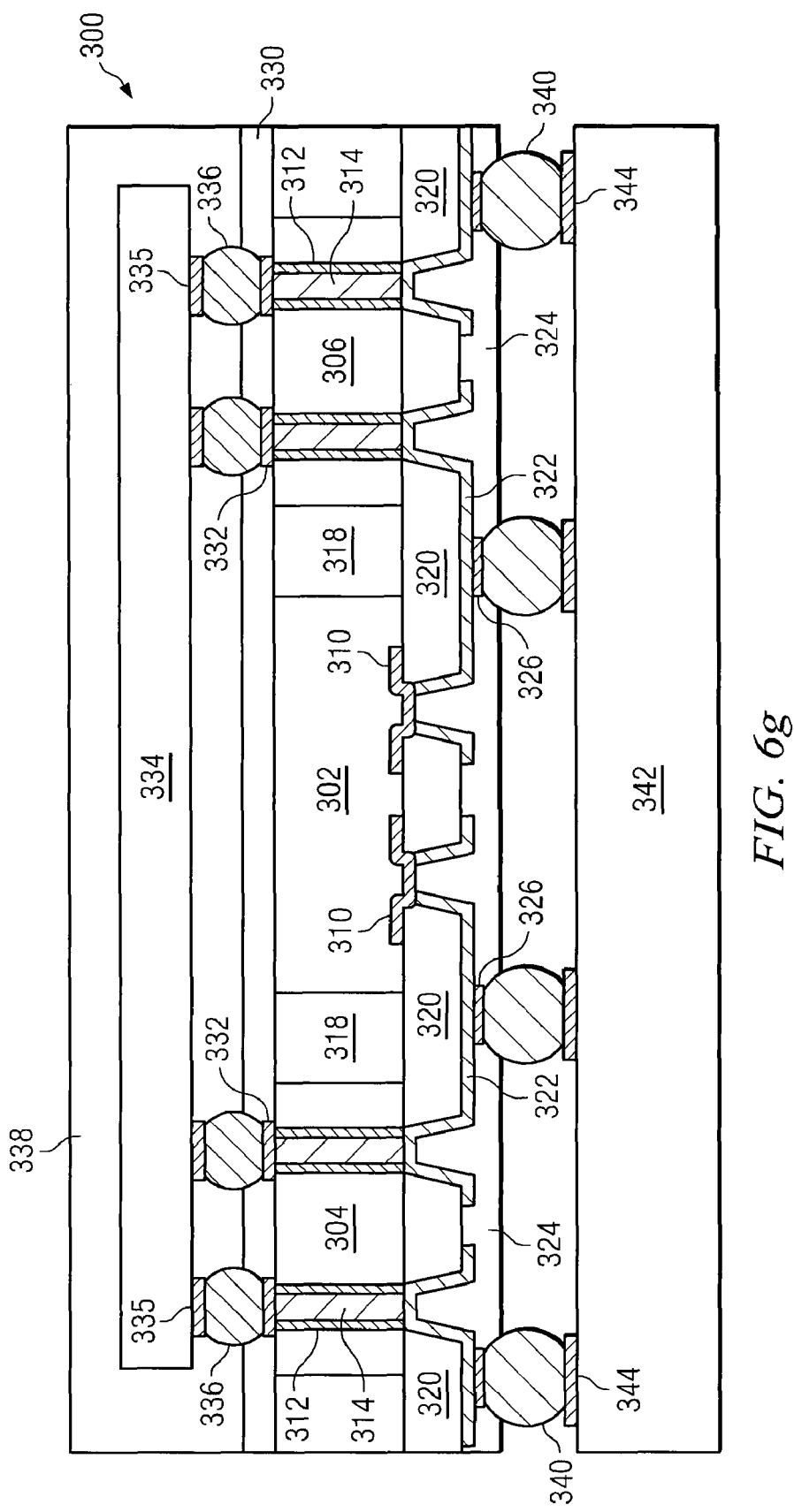

Turning to FIG. 6g, an optional interconnect structure is connected to device 300. The interconnect structure includes solder bumps 340 deposited over insulation layer 324 and electrically connected to metal layer 326. Bumps 340 include an electrically conductive material such as solder. The conductive material is deposited over the patterned regions of insulation layer 324 and is reflowed to form bumps 340. In alternative embodiments, other interconnect structures such as stud bumps, microbumps, pillar bumps, wirebonds, conductive pillars, or other metal connection structures using Cu, Au, or Ni, for example, are connected to semiconductor device 300 to allow for the connection of external system components.

As shown in FIG. 6g, device 300 is mounted to PCB or substrate 342. Contact pads 344 are formed over a surface of substrate 342 and include a conductive material. Bumps 340 are mounted to contact pads 344 and are reflowed to form an electrical and mechanical connection between device 300 and substrate 342.

Figure 7:
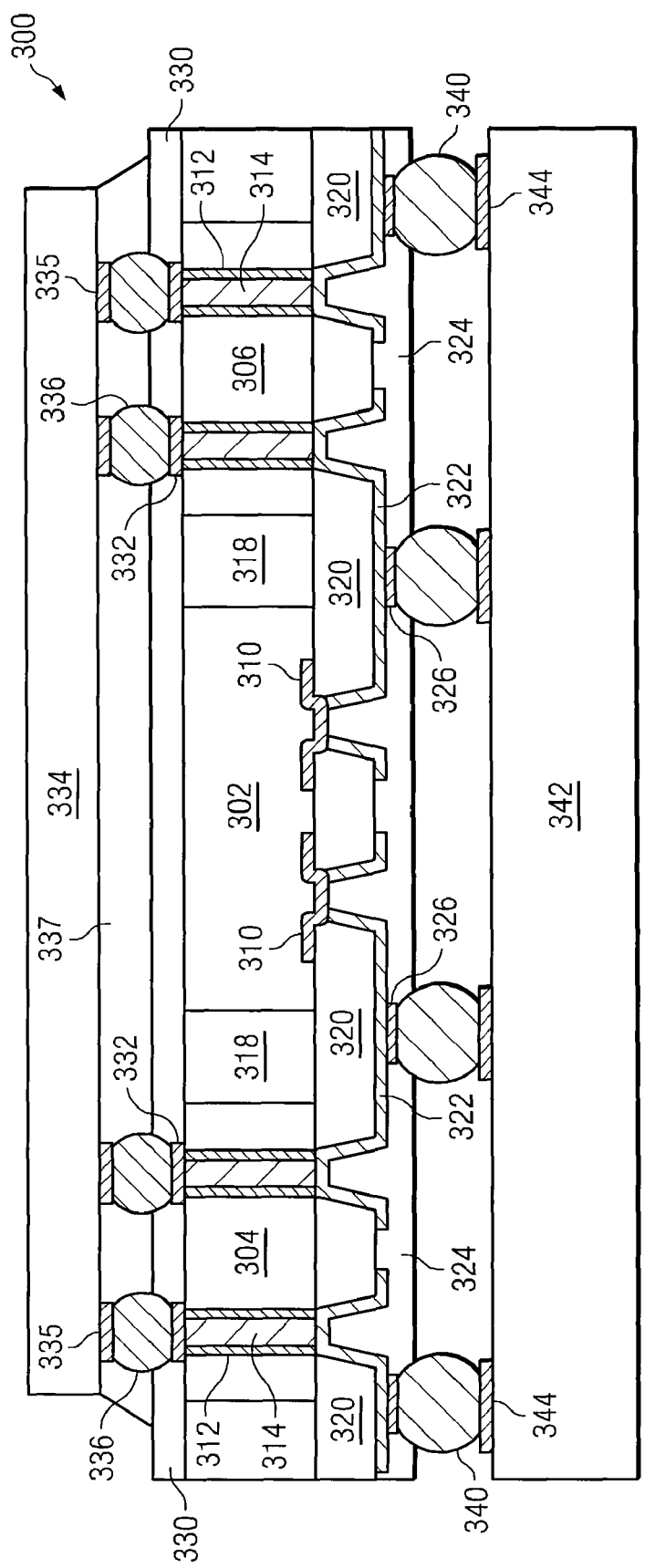
FIG. 7 illustrates a semiconductor device providing a 3D interposer package having a plurality of TSV die, a die is flip-chip mounted to the semiconductor device using an underfill material.

FIG. 7 illustrates semiconductor device 300 providing a 3D interposer package having a plurality of TSV die, a die is flip-chip mounted to semiconductor device 300 using an underfill material. Semiconductor device 300 includes dies 302, 304 and 306. Dies 304 and 306 include pre-fabricated TSVs 314. An RDL structure is formed over first and second surfaces of semiconductor device 300. Die 334 is mounted to semiconductor device 300 using bumps 336. An optional underfill material 337 is deposited between die 334 and passivation layer 330. In one embodiment, capillary action causes underfill 337 to flow between die 334 and passivation layer 330 to form a physical bond between die 334 and passivation layer 330.

Figure 8F:
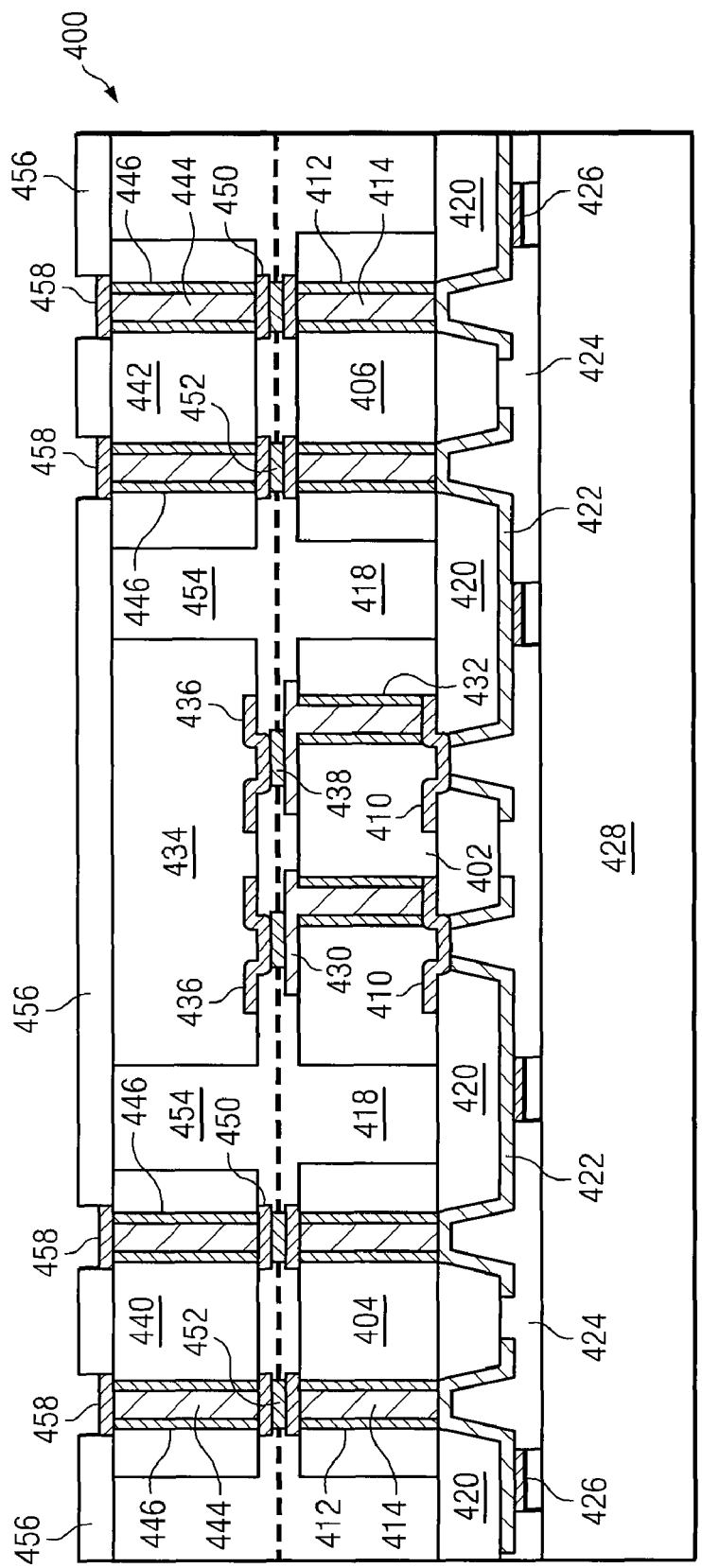

FIGS. 8a-8i illustrate a method of forming semiconductor device 400 providing a 3D interposer package having stacked TSV die, a die is flip-chip mounted to semiconductor device 400. Turning to FIG. 8a, dies 402, 404 and 406 are mounted to carrier 408. Carrier 408 includes a stiff material such as a glass wafer, Si, ceramic, quartz, or flexible tape substrate. In one embodiment, die 402 includes active ICs, while dies 404 and 406 represent 'dummy' or non-functional semiconductor dies having pre-fabricated TSVs. Contact pads 410 are formed over a surface of die 402 using a conductive material, such as Al, Cu, Sn, Ni, Au, or Ag, and are electrically connected to the circuit elements formed within die 402. Contact pads 410 are formed by PVD, CVD, electrolytic plating, or electroless plating processes, for example. Vias are formed in dies 404 and 406 using DRIE, laser drilling, or another etching process. Insulation 412 is deposited into the vias to form a conformal coating within the vias. A conductive material is deposited into the vias to form TSVs 414. TSVs 414 are formed using an evaporation, electrolytic plating, electroless plating, screen printing, PVD, or another suitable metal deposition process and include Al, Cu, Sn, Ni, Au, or Ag or another conductive material. In the present embodiment, TSVs 414 are formed before dies 404 and 406 are mounted to substrate 408 in a separate manufacturing process. An optional insulation or passivation layer 416 is formed over a surface of dies 404 and 406. Insulation layer 416 may be formed before or after TSVs 414.

Turning to FIG. 8b, molding compound 418 is deposited over device 400 to provide electrical isolation and physical support. Molding compound 418 includes epoxy acrylate or other polymer material and is applied by transfer molding, liquid encapsulant molding, or other molding processes. Carrier 408 is removed and device 400 is inverted.

Turning to FIG. 8c, an RDL is formed over device 400. The RDL operates as a conductive network to route electrical signals to various areas of the package, including active and passive circuits of the various semiconductor die, and provides various electrical interconnect options during package integration. Passivation layer 420 is deposited and patterned over dies 402, 404 and 406 and may include an insulation material such as polyimide, BCB, PBO, epoxy based insulating polymer, or other insulating materials. Passivation layer 420 is patterned to expose TSVs 414 of dies 404 and 406 and contact pads 410 of die 402. Metal layer 422 is deposited and patterned over passivation layer 420. Metal layer 422 may include multiple layers of conductive material and may be formed using a PVD, CVD, electrolytic plating, or electroless plating process. Passivation layer 424 is formed over metal layer 422. Passivation layer 424 is patterned to expose portions of metal layer 422. Metal layer 426 is deposited over passivation layer 424. In one embodiment, metal layer 426 includes a UBM that is formed over the exposed portions of metal layer 422. In one embodiment, the UBM includes a wetting layer, barrier layer, and adhesive layer.

Turning to FIG. 8d, device 400 is inverted and molding compound 418 is thinned to expose a backside of die 402 and dies 404 and 406. Molding compound 418 may be thinned using a CMP, mechanical backgrinding, plasma etching, wet etch, dry etch or another thinning process. Carrier 428 is mounted to device 400 to provide physical support and includes a stiff substrate material.

Turning to FIG. 8e, a second level of device die and dummy TSV die is mounted to semiconductor device 400. TSVs 430 are formed in die 402. In other embodiments, TSVs 430 may be formed in die 402 at any time during the fabrication process. In one embodiment, for example, TSVs 430 are formed in die 402 before it is mounted to substrate 408. An optional insulation layer 432 is formed around a perimeter of TSVs 430. A conductive material is deposited into vias formed in die 402 to form TSVs 430. A top portion of TSVs 430 forms a contact pad that is used to interconnect die 402 with other system components. Die 434 having contact pads 436 is mounted to die 402 using bumps 438. Bumps 438 include a conductive material and form an electrical and mechanical connection between dies 402 and 434. In alternative embodiments, conductive adhesives, or other connection mechanisms are used to connect dies 402 and 434.

Dies 440 and 442 are mounted to semiconductor device 400. Vias are formed in dies 440 and 442 using DRIE, laser drilling, or another etching process. Insulation 446 is deposited into the vias to form a conformal coating within the vias. A conductive material is deposited into the vias to form TSVs 444. TSVs 444 are formed using an evaporation, electrolytic plating, electroless plating, screen printing, PVD, or another suitable metal deposition process and include Al, Cu, Sn, Ni, Au, or Ag or another conductive material. In the present embodiment, TSVs 444 are formed before dies 440 and 442 are mounted to device 400. An optional insulation or passivation layer 448 is formed over a surface of dies 440 and 442. Insulation layer 448 may be formed before or after TSVs 444. Contact pads 450 are formed over a surface of dies 440 and 442 in electrical contact with TSVs 444. Dies 440 and 442 are mounted to dies 402 and 404 using bumps 452. Bumps 452 include a conductive material and form an electrical and mechanical connection between dies 440 and 442 and dies 402 and 404. In alternative embodiments, conductive adhesives, or other connection mechanisms are used to connect dies 440 and 442 and dies 402 and 404.

Turning to FIG. 8f, molding compound 454 is deposited over device 400 to provide electrical insulation and mechanical protection to die 434 and dies 440 and 442. Molding compound 454 includes epoxy acrylate or other polymer material and is applied by transfer molding, liquid encapsulant molding, or other molding processes. An additional RDL structure is formed over device 400. Molding compound 454 is thinned to expose dies 434, 440 and 442. Passivation layer 456 includes an insulative material and is deposited over dies 434, 440 and 442. Passivation layer 456 is patterned to expose TSVs 444 of dies 440 and 442. Metal layer 458 is deposited over passivation layer 456 and electrically connected to TSVs 444. In one embodiment, metal layer 458 includes a UBM that is formed over TSVs 444. In one embodiment, the UBM includes a wetting layer, barrier layer, and adhesive layer.

Figure 8G:
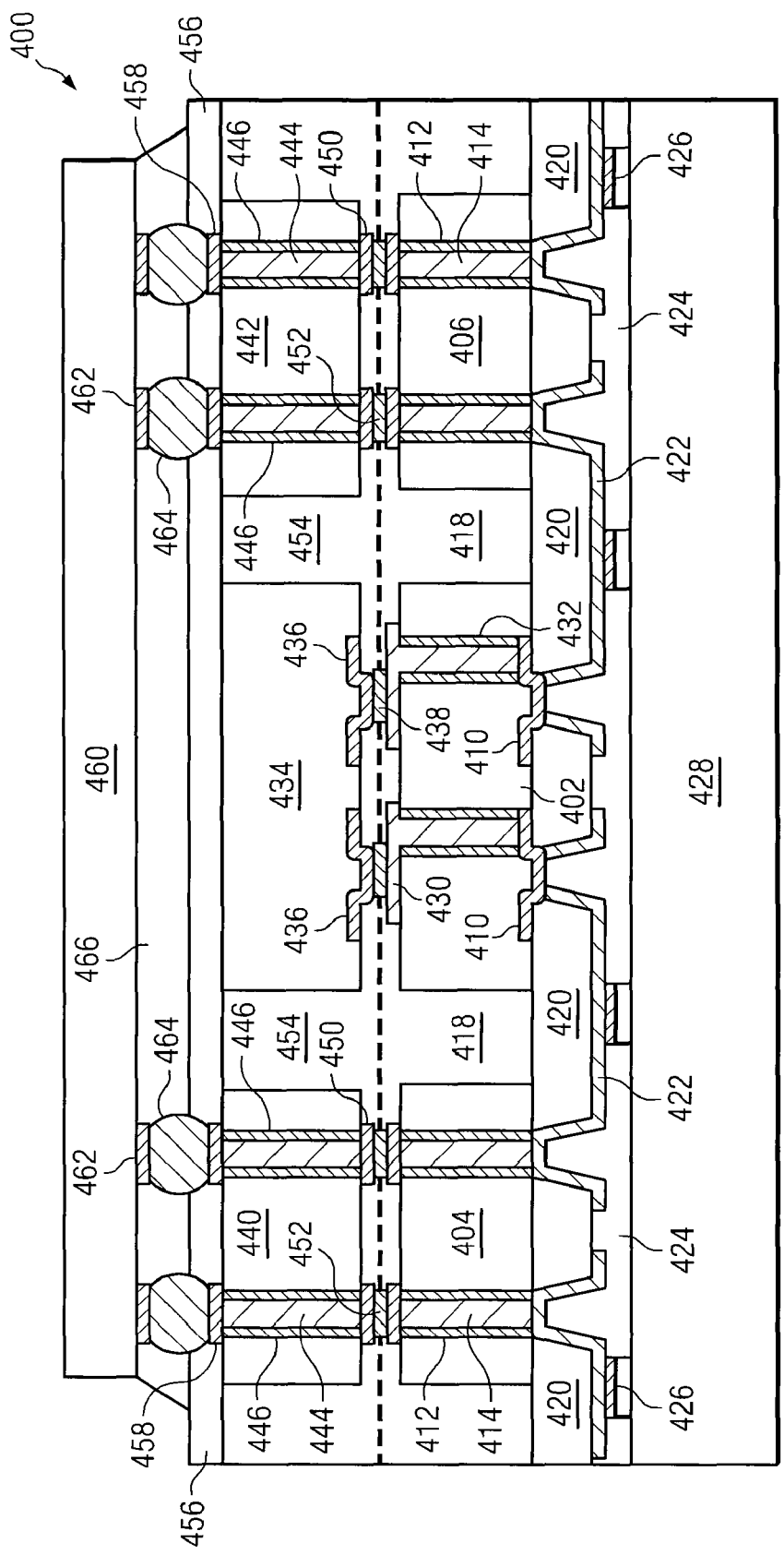

Turning to FIG. 8g, die 460 is flip-chip mounted to device 400 using solder bumps 464. Die 460 includes contact pads 462 formed over a surface of die 460 using a conductive material, such as Al, Cu, Sn, Ni, Au, or Ag. Contact pads 462 are formed by PVD, CVD, electrolytic plating, or electroless plating processes, for example. Die 460 includes general application integrated circuits such as filters, memory, and processors, for example. Bumps 464 include an electrically conductive material such as solder, Sn, Pb, Au, Ag, Cu, Zn, Bi, and alloys thereof, with an optional flux material. For example, the solder material can be eutectic Sn/Pb, high lead, or lead free. The solder material is deposited between metal layer or UBM 458 and contact pads 462 of die 460. The solder material is then reflowed to form bumps 464 which form an electrical and mechanical connection between die 460 and device 400. In alternative embodiments, other interconnect structures such as stud bumping, wirebonds or conductive pillars are used to form the connection between die 460 and device 400. An optional underfill material 466 is deposited between die 460 and passivation layer 456. In one embodiment, capillary action causes underfill 466 to flow between die 460 and passivation layer 456 to form a physical bond between die 460 and passivation layer 456.

Figure 8H:
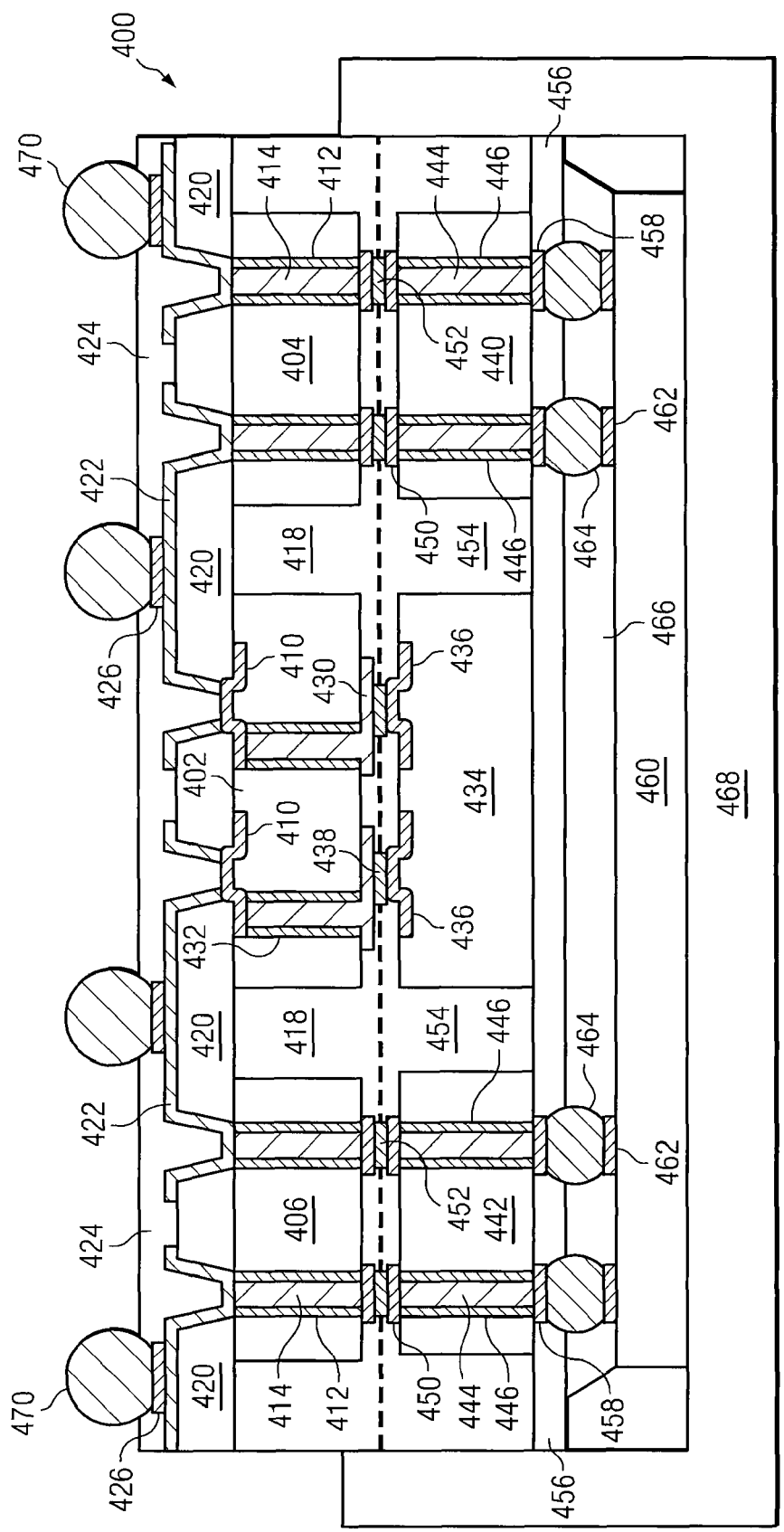

Turning to FIG. 8h, device 400 is placed in mechanical clamp 468 and carrier 428 is removed. An optional interconnect structure is connected to device 400. The interconnect structure includes solder bumps 470 deposited over insulation layer 424 and electrically connected to metal layer 426. Bumps 470 include an electrically conductive material such as solder. The conductive material is deposited over the patterned regions of insulation layer 424 and is reflowed to form bumps 470. In alternative embodiments, other interconnect structures such as stud bumps, microbumps, pillar bumps, wirebonds, conductive pillars, or other metal connection structures using Cu, Au, or Ni, for example, are connected to semiconductor device 400 to allow for the connection of external system components.

Figure 8I:
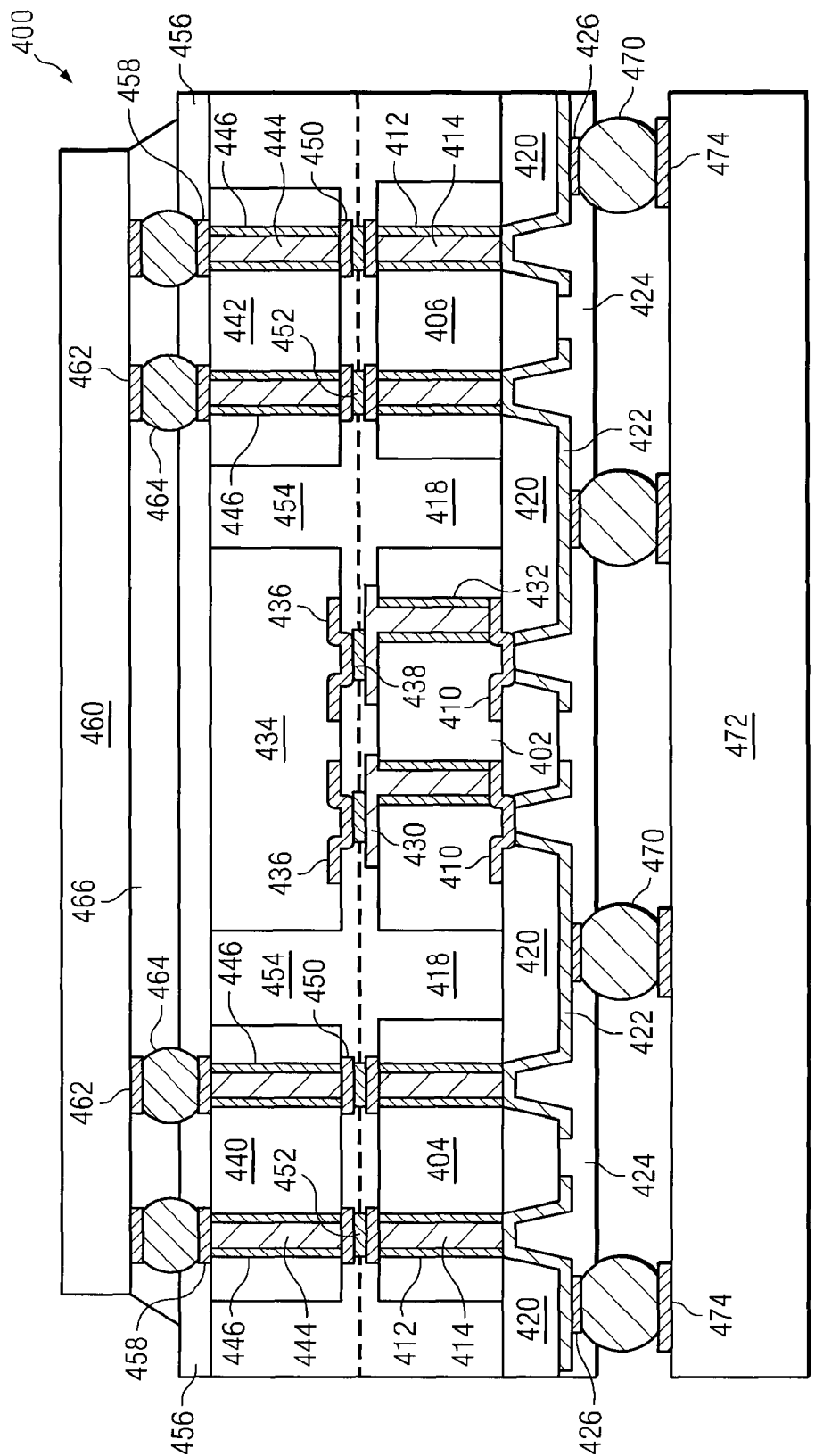

Turning to FIG. 8i, device 400 is removed from clamp 468 and mounted to PCB or substrate 472. Contact pads 474 are formed over a surface of substrate 472 and include a conductive material. Bumps 470 are mounted to contact pads 474 and are reflowed to form an electrical and mechanical connection between device 400 and substrate 472.

Figures 9D, 9E:
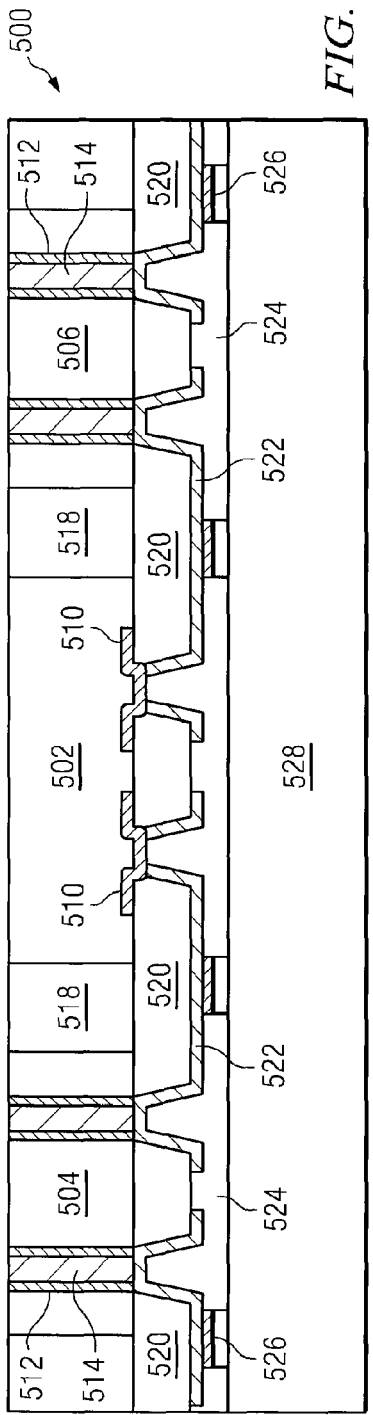

FIGS. 9a-9i illustrate a method of forming semiconductor device 500 providing a 3D interposer package having stacked TSV die, a semiconductor package is mounted to semiconductor device 500. Turning to FIG. 9a, dies 502, 504 and 506 are mounted to carrier 508. Carrier 508 includes a stiff material such as a glass wafer, Si, ceramic, quartz, or flexible tape substrate. In one embodiment, die 502 includes active ICs, while dies 504 and 506 represent 'dummy' or non-functional semiconductor dies having pre-fabricated TSVs. Contact pads 510 are formed over a surface of die 502 using a conductive material, such as Al, Cu, Sn, Ni, Au, or Ag, and are electrically connected to the circuit elements formed within die 502. Contact pads 510 are formed by PVD, CVD, electrolytic plating, or electroless plating processes, for example. Vias are formed in dies 504 and 506 using DRIE, laser drilling, or another etching process. Insulation 512 is deposited into the vias to form a conformal coating within the vias. A conductive material is deposited into the vias to form TSVs 514. TSVs 514 are formed using an evaporation, electrolytic plating, electroless plating, screen printing, PVD, or another suitable metal deposition process and include Al, Cu, Sn, Ni, Au, or Ag or another conductive material. In the present embodiment, TSVs 514 are formed before dies 504 and 506 are mounted to substrate 508 in a separate manufacturing process. An optional insulation or passivation layer 516 is formed over a surface of dies 504 and 506. Insulation layer 516 may be formed before or after TSVs 514.

Turning to FIG. 9b, molding compound 518 is deposited over device 500 to provide electrical isolation and physical support. Molding compound 518 includes epoxy acrylate or other polymer material and is applied by transfer molding, liquid encapsulant molding, or other molding processes. Carrier 508 is removed and device 500 is inverted.

Turning to FIG. 9c, an RDL is formed over device 500. The RDL operates as a conductive network to route electrical signals to various areas of the package, including active and passive circuits of the various semiconductor die, and provides various electrical interconnect options during package integration. Passivation layer 520 is deposited and patterned over dies 502, 504 and 506 and may include an insulation material such as polyimide, BCB, PBO, epoxy based insulating polymer, or other insulating materials. Passivation layer 520 is patterned to expose TSVs 514 of dies 504 and 506 and contact pads 510 of die 502. Metal layer 522 is deposited and patterned over passivation layer 520. Metal layer 522 may include multiple layers of conductive material and may be formed using a PVD, CVD, electrolytic plating, or electroless plating process. Passivation layer 524 is formed over metal layer 522. Passivation layer 524 is patterned to expose portions of metal layer 522. Metal layer 526 is deposited over passivation layer 524. In one embodiment, metal layer 526 includes a UBM that is formed over the exposed portions of metal layer 522. In one embodiment, the UBM includes a wetting layer, barrier layer, and adhesive layer.

Turning to FIG. 9d, device 500 is inverted and molding compound 518 is thinned to expose a backside of die 502 and dies 504 and 506. Molding compound 518 may be thinned using a CMP, mechanical backgrinding, plasma etching, wet etch, dry etch or another thinning process. Carrier 528 is mounted to device 500 to provide physical support and includes a stiff substrate material.

Turning to FIG. 9e, a second level of device die and dummy TSV die is mounted to semiconductor device 500. TSVs 530 are formed in die 502. In other embodiments, TSVs 530 may be formed in die 502 at any time during the fabrication process. In one embodiment, for example, TSVs 530 are formed in die 502 before it is mounted to substrate 508. An optional insulation layer 532 is formed around a perimeter of TSVs 530. A conductive material is deposited into vias formed in die 502 to form TSVs 530. A top portion of TSVs 530 forms a contact pad that is used to interconnect die 502 with other system components. Die 534 having contact pads 536 is mounted to die 502 using bumps 538. Bumps 538 include a conductive material and form an electrical and mechanical connection between dies 502 and 534. In alternative embodiments, conductive adhesives, or other connection mechanisms are used to connect dies 502 and 534.

Dies 540 and 542 are mounted to semiconductor device 500. Vias are formed in dies 540 and 542 using DRIE, laser drilling, or another etching process. Insulation 546 is deposited into the vias to form a conformal coating within the vias. A conductive material is deposited into the vias to form TSVs 544. TSVs 544 are formed using an evaporation, electrolytic plating, electroless plating, screen printing, PVD, or another suitable metal deposition process and include Al, Cu, Sn, Ni, Au, or Ag or another conductive material. In the present embodiment, TSVs 544 are formed before dies 540 and 542 are mounted to device 500. An optional insulation or passivation layer 548 is formed over a surface of dies 540 and 542. Insulation layer 548 may be formed before or after TSVs 544. Contact pads 550 are formed over a surface of dies 540 and 542 in electrical contact with TSVs 544. Dies 540 and 542 are mounted to dies 502 and 504 using bumps 552. Bumps 552 include a conductive material and form an electrical and mechanical connection between dies 540 and 542 and dies 502 and 504. In alternative embodiments, conductive adhesives, or other connection mechanisms are used to connect dies 540 and 542 and dies 502 and 504.

Figure 9F:
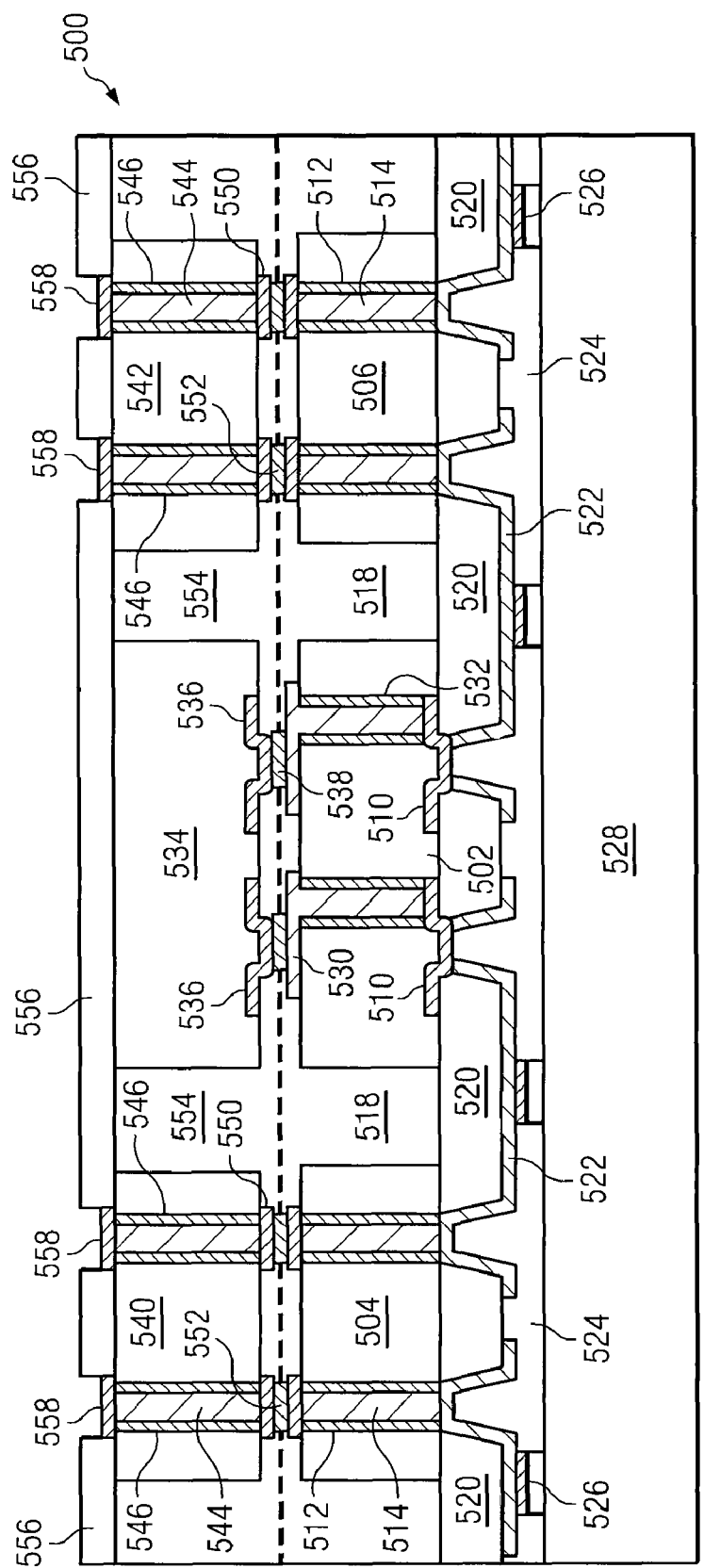

Turning to FIG. 9f, molding compound 554 is deposited over device 500 to provide electrical insulation and mechanical protection to die 534 and dies 540 and 542. Molding compound 554 includes epoxy acrylate or other polymer material and is applied by transfer molding, liquid encapsulant molding, or other molding processes. An additional RDL structure is formed over device 500. Molding compound 554 is thinned to expose dies 534, 540 and 542. Passivation layer 556 includes an insulative material and is deposited over dies 534, 540 and 542. Passivation layer 556 is patterned to expose TSVs 544 of dies 540 and 542. Metal layer 558 is deposited over passivation layer 556 and electrically connected to TSVs 544. In one embodiment, metal layer 558 includes a UBM that is formed over TSVs 544. In one embodiment, the UBM includes a wetting layer, barrier layer, and adhesive layer.

Figure 9G:
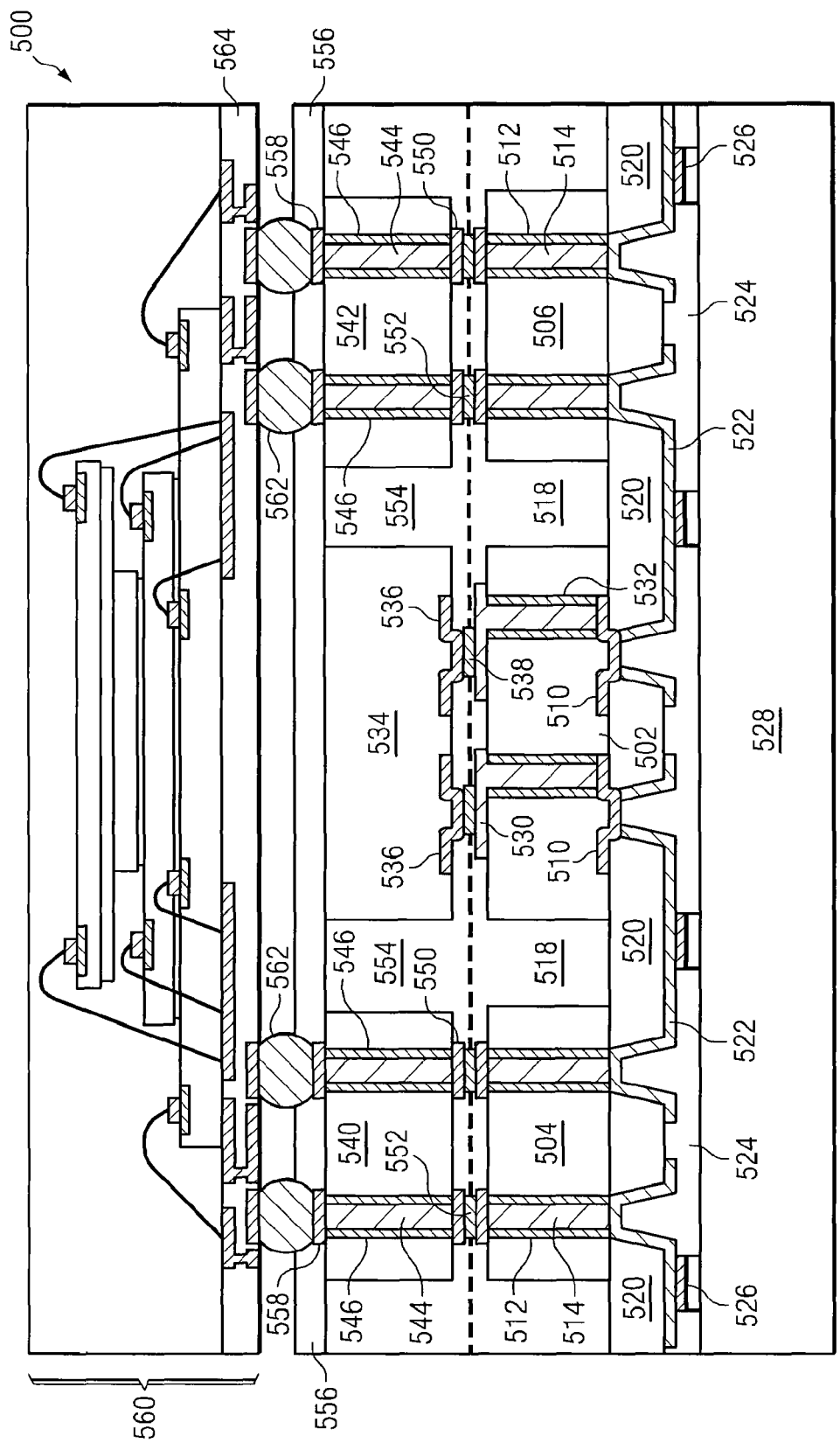

Turning to FIG. 9g, semiconductor package 560 is mounted to device 500 using solder bumps 562. Package 560 includes one or more pre-packaged semiconductor die and includes contact pads for connecting package 560 to external systems. Package 560 includes general application integrated circuits such as filters, memory chips, and processors, for example. Package 560 is connected to device 500 using solder bumps 562. Bumps 562 include an electrically conductive material such as solder, Sn, Pb, Au, Ag, Cu, Zn, Bi, and alloys thereof, with an optional flux material. For example, the solder material can be eutectic Sn/Pb, high lead, or lead free. The solder material is deposited between metal layer or UBM 558 and the contact pads of package 560. The solder material is then reflowed to form bumps 562 which form an electrical and mechanical connection between package 560 and device 500. In alternative embodiments, other interconnect structures such as stud bumping, wirebonds or conductive pillars are used to form the connection between package 560 and device 500.

In one embodiment, as shown in FIG. 9g, package 560 includes substrate or PCB 564 over which a plurality of semiconductor dies are mounted. PCB 564 includes contact pads formed over opposing surfaces of PCB 564 and an interconnect structure formed in PCB 564 to connect the contact pads. The semiconductor dies are mounted over PCB 564 using die attach adhesive. The dies are electrically connected to one another and PCB 564 using a plurality of wirebonds. A molding or encapsulant material is deposited over the dies and PCB 564 to provide electrical isolation and mechanical protection for package 560. In alternative embodiments, however, package 560 includes any combination of semiconductor dies and other components to provide the required functionality. In many cases, package 560 is pre-manufactured and tested before being integrated into device 500.

Figure 9H:
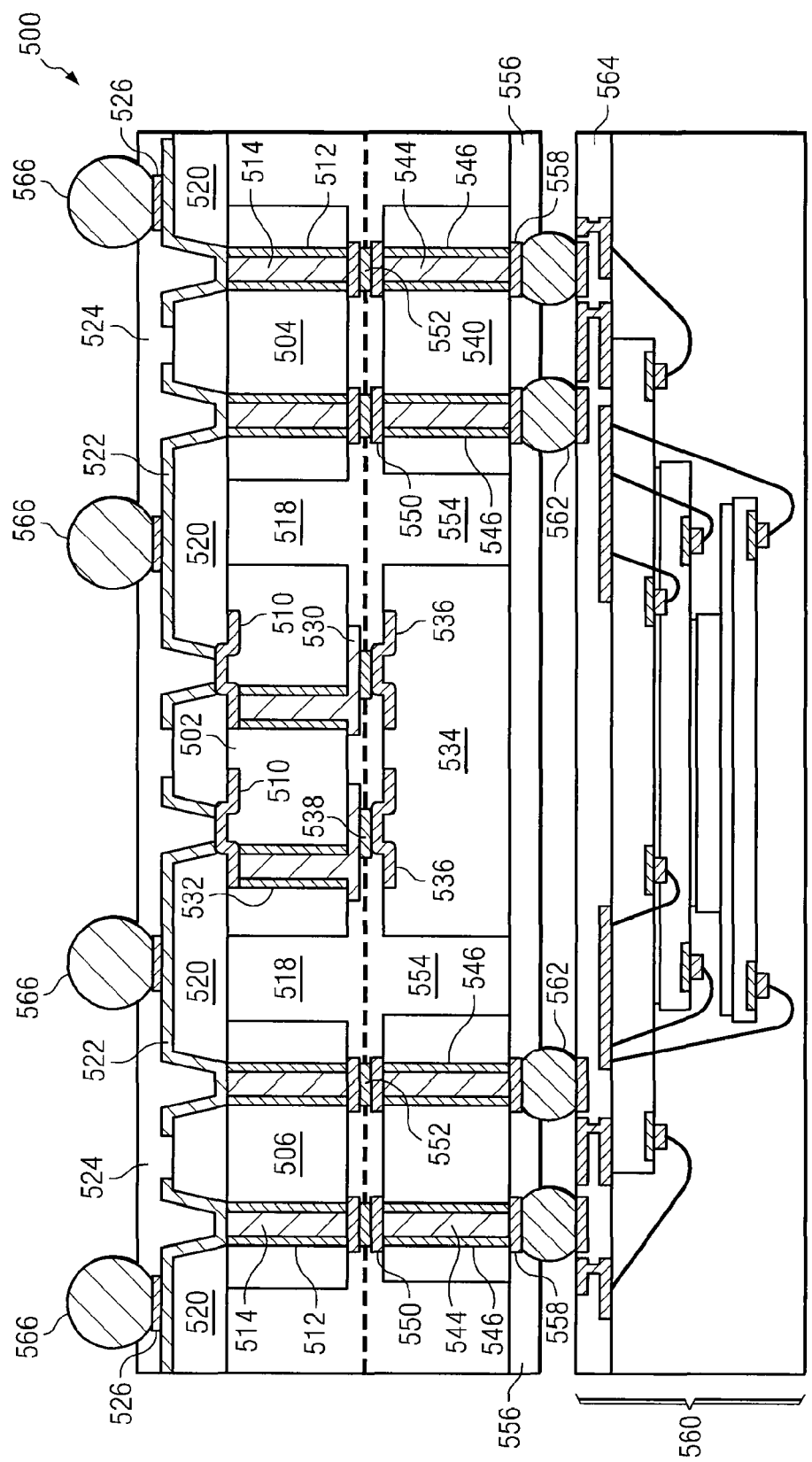

Turning to FIG. 9h, carrier 528 may be removed and an optional interconnect structure is connected to semiconductor device 500. The interconnect structure includes solder bumps 566 deposited over insulation layer 524 and electrically connected to metal layer 526. Bumps 566 include an electrically conductive material such as solder. The conductive material is deposited over the patterned regions of insulation layer 524 and is reflowed to form bumps 566. In alternative embodiments, other interconnect structures such as stud bumps, microbumps, pillar bumps, wirebonds, conductive pillars, or other metal connection structures using Cu, Au, or Ni, for example, are connected to semiconductor device 500 to allow for the connection of external system components.

Figure 9I:
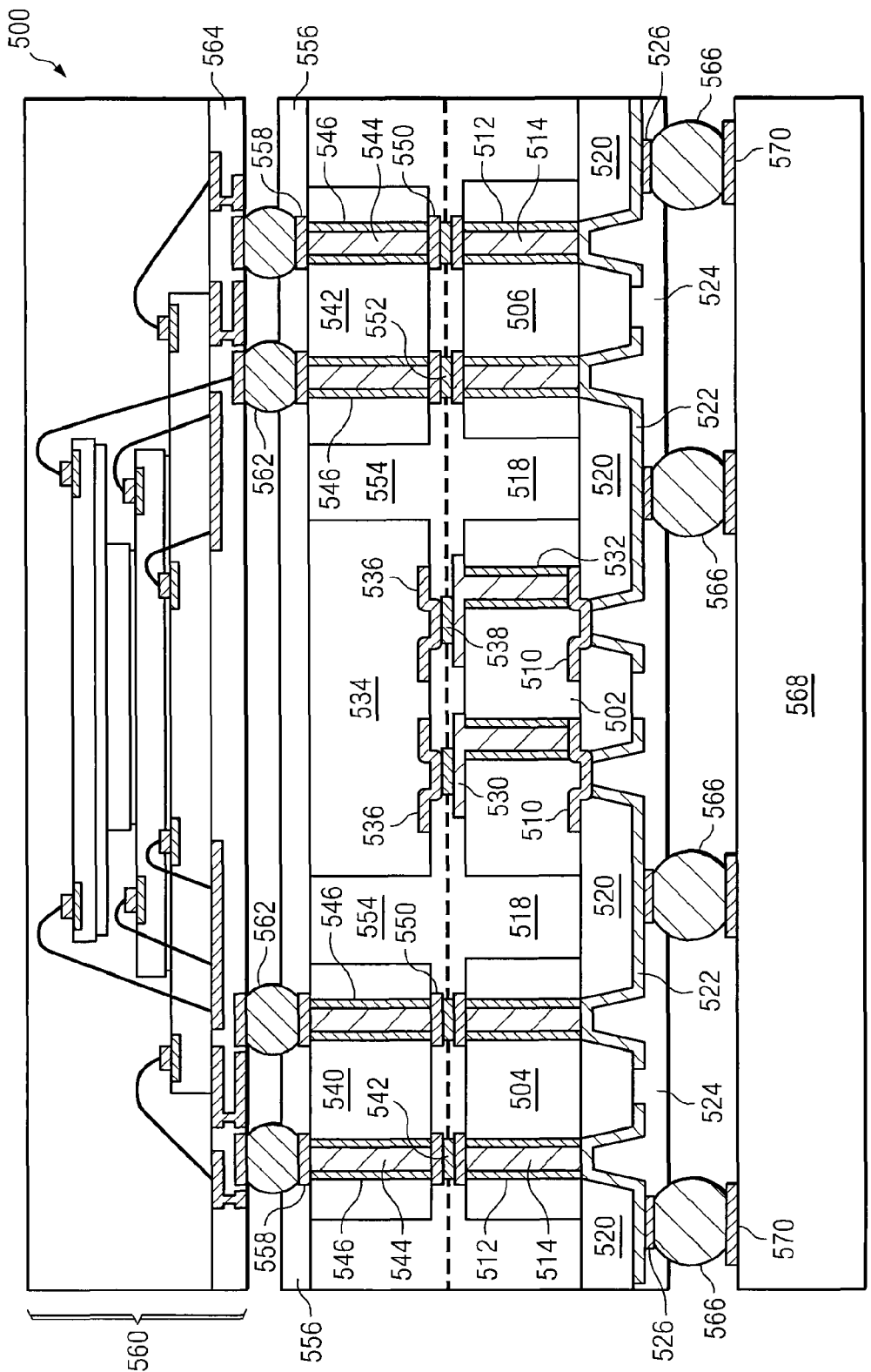

Turning to FIG. 9i, device 500 is mounted to PCB or substrate 568. Contact pads 570 are formed over a surface of substrate 568 and include a conductive material. Bumps 566 are mounted to contact pads 570 and are reflowed to form an electrical and mechanical connection between device 500 and substrate 568.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a carrier for supporting the semiconductor device;
    mounting a first semiconductor die over the carrier;
    mounting a first dummy die having a first through-silicon via (TSV) over the carrier;
    encapsulating the first semiconductor die and the first dummy die using a wafer molding material;
    removing the carrier;
    forming a first redistribution layer (RDL) over a first surface of the first semiconductor die and a first surface of the first dummy die to electrically connect the first TSV and a contact pad of the first semiconductor die;
    forming an insulation layer over the first RDL;
    forming a second RDL over a second surface of the first dummy die opposite the first surface of the first dummy die and electrically connected to the first TSV; and
    connecting a semiconductor package to the second RDL.

2. The method of claim 1, including:
    forming a second TSV in the first semiconductor die;
    mounting a second semiconductor die over the first semiconductor die to connect to the second TSV; and mounting a second dummy die over the first dummy die to connect to the first TSV.

3. The method of claim 1, including connecting the second RDL to a printed circuit board (PCB).

4. The method of claim 1, wherein the second RDL connects to a plurality of bumps.

5. The method of claim 1, wherein the first dummy die includes alignment markings to control placement of the first dummy die over the carrier.

6. The method of claim 1, wherein connecting the semiconductor package to the second RDL includes flip-chip mounting a second semiconductor die to the second RDL.

7. The method of claim 6, including thinning the wafer molding material to expose the second surface of the first dummy die and a second surface of the first semiconductor die opposite the first surface of the first semiconductor die.

8. A method of making a semiconductor device, comprising:
providing a temporary carrier;
mounting a first semiconductor die over the temporary carrier;
mounting a first dummy die having a first through-silicon via (TSV) over the temporary carrier;
depositing encapsulant over the first semiconductor die and the first dummy die;
forming a first conductive layer electrically connected to the first semiconductor die and first TSV; and
forming a second conductive layer electrically connected to the first TSV.

9. The method of claim 8, including:
forming a second TSV in the first semiconductor die;
mounting a second semiconductor die over the first semiconductor die to connect to the second TSV; and
mounting a second dummy die over the first dummy die to connect to the first TSV.

10. The method of claim 8, including thinning the encapsulant to expose a surface of the first semiconductor die and a surface of the first dummy die.

11. The method of claim 8, further including forming a plurality of bumps over the second conductive layer.

12. The method of claim 8, wherein the first dummy die includes alignment markings to control placement of the first dummy die over the temporary carrier.

13. The method of claim 8, including connecting the second conductive layer to a printed circuit board (PCB).

14. The method of claim 8, including connecting a semiconductor package to the second conductive layer.

15. The method of claim 14, wherein connecting the semiconductor package to the second conductive layer includes flip-chip mounting a second semiconductor die to the second conductive layer.

16. A method of making a semiconductor device, comprising:
providing a carrier;
mounting a first semiconductor die over the carrier;
mounting a second semiconductor die including a conductive via over the carrier;
forming a first conductive layer connected to the first semiconductor die and the conductive via; and
forming a second conductive layer connected to the conductive via.

17. The method of claim 16, wherein the second semiconductor die includes alignment markings to control placement of the second semiconductor die over the carrier.

18. The method of claim 16, including connecting a semiconductor package to the second conductive layer.

19. The method of claim 18, wherein connecting a semiconductor package to the second conductive layer includes flip-chip mounting a third semiconductor die to the second conductive layer.

20. The method of claim 19, including connecting the second conductive layer to a printed circuit board (PCB).

21. A semiconductor device, comprising:
a first semiconductor die;
a first dummy die including a through-silicon via (TSV) extending through the first dummy die such that the TSV has a first surface coplanar with a first surface of the first semiconductor die;
encapsulant deposited over and extends between the first semiconductor die and the first dummy die;
a first conductive layer formed over the first surface of the first semiconductor die and the first surface of the TSV to electrically connect the first semiconductor die and the TSV; and
a second conductive layer connected to a second surface of the TSV opposite the first surface of the TSV.

22. The semiconductor device of claim 21, further including:
a second semiconductor die mounted over the first semiconductor die and electrically connected to the first semiconductor die; and
a second dummy die mounted over the first dummy die and electrically connected to the TSV.

23. The semiconductor device of claim 21, wherein the first dummy die includes alignment markings to control placement of the first dummy die.

24. The semiconductor device of claim 21, further including a semiconductor package connected to the second conductive layer.

25. The semiconductor device of claim 24, wherein the semiconductor package includes a second semiconductor die flip-chip mounted to the second conductive layer.

26. A semiconductor device, comprising:
a first semiconductor die;
a first dummy die including a via that has a first surface coplanar with a first surface of the first semiconductor die;
a first conductive layer formed over the first surface of the first semiconductor die and the first surface of the via to electrically connect the first semiconductor die and the via; and
a second conductive layer connected to a second surface of the via opposite the first surface of the via.

27. The semiconductor device of claim 26, further including a semiconductor package connected to the second conductive layer.

28. The semiconductor device of claim 26, further including encapsulant deposited between the first semiconductor die and the first dummy die.

29. The semiconductor device of claim 26, further including:
a second semiconductor die mounted over the first semiconductor die and electrically connected to the first semiconductor die; and
a second dummy die mounted over the first dummy die and electrically connected to the via.

30. The semiconductor device of claim 26, wherein the first dummy die includes alignment markings to control placement of the first dummy die.

31. The semiconductor device of claim 26, further including connecting the second conductive layer to a printed circuit board (PCB).

* * * * *